(12) United States Patent
Kim et al.

(10) Patent No.: US 10,522,537 B2
(45) Date of Patent: Dec. 31, 2019

(54) INTEGRATED CIRCUIT DEVICE

(71) Applicant: SAMSUNG ELECTRONICS CO., LTD., Suwon-si, Gyeonggi-Do (KR)

(72) Inventors: Changhwa Kim, Hwaseong-si (KR); Kyungin Choi, Seoul (KR); Hwichan Jun, Yongin-si (KR); Inchan Hwang, Siheung-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/937,093

(22) Filed: Mar. 27, 2018

(65) Prior Publication Data

US 2018/0219010 A1    Aug. 2, 2018

Related U.S. Application Data

(63) Continuation of application No. 15/442,859, filed on Feb. 27, 2017, now Pat. No. 10,043,800.

(30) Foreign Application Priority Data

Sep. 22, 2016 (KR) .................. 10-2016-0121465

(51) Int. Cl.
*H01L 27/08* (2006.01)
*H01L 27/088* (2006.01)
(Continued)

(52) U.S. Cl.
CPC .... *H01L 27/0886* (2013.01); *H01L 21/02362* (2013.01); *H01L 21/768* (2013.01); *H01L 21/76801* (2013.01); *H01L 21/76825* (2013.01); *H01L 21/76829* (2013.01); *H01L 21/76831* (2013.01); *H01L 21/76834* (2013.01);
(Continued)

(58) Field of Classification Search
CPC .............. H01L 27/0886; H01L 27/768; H01L 21/823437; H01L 21/823462; H01L 21/823468; H01L 29/6653; H01L 29/66795; H01L 21/76829; H01L 21/02362
See application file for complete search history.

(56) References Cited

U.S. PATENT DOCUMENTS 6,483,138 B1    11/2002    Habu et al.
8,741,723 B2    6/2014    Chi
(Continued)

*Primary Examiner* — Feifei Yeung Lopez
(74) *Attorney, Agent, or Firm* — F. Chau & Associates, LLC

(57) ABSTRACT

An integrated circuit device includes a substrate including a device active region, a fin-type active region protruding from the substrate on the device active region, a gate line crossing the fin-type active region and overlapping a surface and opposite sidewalls of the fin-type active region, an insulating spacer disposed on sidewalls of the gate line, a source region and a drain region disposed on the fin-type active region at opposite sides of the gate line, a first conductive plug connected the source or drain regions, and a capping layer disposed on the gate line and extending parallel to the gate line. The capping layer includes a first part overlapping the gate line, and a second part overlapping the insulating spacer. The first and second parts have different compositions with respect to each other. The second part contacts the first part and the first conductive plug.

15 Claims, 45 Drawing Sheets

(51) Int. Cl.
*H01L 21/768* (2006.01)
*H01L 21/02* (2006.01)
*H01L 21/8234* (2006.01)
*H01L 23/528* (2006.01)
*H01L 27/02* (2006.01)
*H01L 29/51* (2006.01)
*H01L 29/66* (2006.01)
*H01L 29/78* (2006.01)
*H01L 21/3115* (2006.01)
*H01L 21/311* (2006.01)

(52) U.S. Cl.
CPC ........... *H01L 21/76897* (2013.01); *H01L 21/823431* (2013.01); *H01L 21/823437* (2013.01); *H01L 21/823462* (2013.01); *H01L 21/823468* (2013.01); *H01L 21/823475* (2013.01); *H01L 21/823481* (2013.01); *H01L 23/5283* (2013.01); *H01L 27/0207* (2013.01); *H01L 29/517* (2013.01); *H01L 29/6653* (2013.01); *H01L 29/66545* (2013.01); *H01L 29/66795* (2013.01); *H01L 29/785* (2013.01); *H01L 21/31116* (2013.01); *H01L 21/31155* (2013.01); *H01L 29/7854* (2013.01)

(56) References Cited

U.S. PATENT DOCUMENTS

| | | | |
|---|---|---|---|
| 8,969,163 B2 | 3/2015 | Aquilino et al. | |
| 9,147,747 B2 | 9/2015 | Hung et al. | |
| 9,324,883 B2 | 4/2016 | Funayama et al. | |
| 2006/0263985 A1 | 11/2006 | Kang et al. | |
| 2010/0038679 A1* | 2/2010 | Chan | H01L 29/66795 257/190 |
| 2014/0070285 A1* | 3/2014 | Xie | H01L 29/66545 257/288 |
| 2014/0179082 A1* | 6/2014 | Foster | H01L 21/67086 438/424 |
| 2015/0021710 A1 | 1/2015 | Hsu et al. | |
| 2015/0035086 A1* | 2/2015 | Xie | H01L 29/66545 257/411 |
| 2015/0084102 A1* | 3/2015 | Park | H01L 29/785 257/288 |
| 2015/0311082 A1 | 10/2015 | Bouche et al. | |
| 2015/0332962 A1 | 11/2015 | Chen et al. | |
| 2016/0049332 A1* | 2/2016 | Xie | H01L 21/76897 257/288 |
| 2016/0141417 A1 | 5/2016 | Park et al. | |
| 2016/0148999 A1* | 5/2016 | Ok | H01L 29/0649 257/387 |
| 2016/0284641 A1* | 9/2016 | Liou | H01L 23/5226 |
| 2018/0083002 A1 | 3/2018 | Kim et al. | |

* cited by examiner

INTEGRATED CIRCUIT DEVICE

CROSS-REFERENCE TO RELATED APPLICATIONS

This application is a continuation of U.S. application Ser. No. 15/442,859, filed on Feb. 27, 2017, which claims priority under 35 U.S.C. § 119 to Korean Patent Application No. 10-2016-0121465, filed on Sep. 22, 2016, in the Korean Intellectual Property Office, the disclosures of which are incorporated by reference herein in their entireties.

TECHNICAL FIELD

The inventive concept relates to an integrated circuit device, and more particularly, to an integrated circuit device having a contact plug connected to a field effect transistor.

DISCUSSION OF THE RELATED ART

Along with other developments in the electronic industry, the size of semiconductor devices is rapidly decreasing. In such down-scaled devices, isolation margins should be maintained while reducing the interval between an interconnection layer and a contact.

SUMMARY

According to an exemplary embodiment of the inventive concept, an integrated circuit device includes a substrate including a device active region, a fin-type active region protruding in a first direction from the substrate on the device active region, a gate line crossing the fin-type active region, the gate line overlapping an upper surface and opposite sidewalls of the fin-type active region, an insulating spacer disposed on sidewalls of the gate line, a first source/drain region disposed on the fin-type active region at a first side of the gate line and a second source/drain region disposed on the fin-type active region at a second side of the gate line, a first conductive plug connected to at least one of the first source/drain region and the second source/drain region, and a capping layer disposed on the gate line, the capping layer extending substantially parallel to the gate line. The capping layer includes a first part overlapping the gate line and extending substantially parallel to the gate line, and a second part overlapping the insulating spacer. The first part and the second part have different compositions with respect to each other. The second part contacts the first part and the first conductive plug.

According to an exemplary embodiment of the inventive concept, an integrated circuit device includes a substrate including a device active region, a plurality of fin-type active regions protruding in a first direction from the substrate on the device active region, the plurality of fin-type active regions extending in a second direction perpendicular to the first direction, a plurality of gate lines disposed on the plurality of fin-type active regions, the plurality of gate lines extending in a third direction crossing the second direction and perpendicular to the first direction, a plurality of insulating spacers disposed on opposite sidewalls of respective gate lines of the plurality of gate lines, a plurality of source and drain regions disposed on the plurality of fin-type active regions, wherein pairs of source and drain regions are disposed at opposite sides of respective gate lines of the plurality of gate lines, a first conductive plug connected to at least one pair of the plurality of source and drain regions between two adjacent gate lines of the plurality of gate lines, a plurality of first capping layers overlapping the plurality of gate lines, the plurality of first capping layers extending parallel to the plurality of gate lines, and at least one second capping layer overlapping at least one of the plurality of insulating spacers, the at least one second capping layer contacting at least one of the plurality of first capping layers and the first conductive plug. The plurality of first capping layers and the at least one second capping layer have different compositions with respect to each other.

According to an exemplary embodiment of the inventive concept, an integrated circuit device includes a substrate including a device active region, a fin-type active region protruding in a first direction from the substrate on the device active region, a first gate line crossing the fin-type active region, the first gate line covering an upper surface and opposite sidewalls of the fin-type active region, an insulating spacer disposed on sidewalls of the first gate line, a first drain region and a first source region disposed on the fin-type active region at opposite sides of the first gate line, a first conductive plug connected to the first drain region and a second conductive plug connected to the first source region, and a first capping layer disposed on the first gate line, the first capping layer extending substantially parallel to the first gate line. The first capping layer includes a first part and a second part having different compositions with respect to each other. The first part overlaps the first gate line and extends substantially parallel to the first gate line and the second part overlaps the insulating spacer. The first gate line is disposed between the first and second conductive plugs and is separated from the first and second conductive plugs by the insulating spacer.

BRIEF DESCRIPTION OF THE DRAWINGS

The above and other features of the inventive concept will become more apparent by describing in detail exemplary embodiments thereof in conjunction with the accompanying drawings, in which.

DETAILED DESCRIPTION OF THE EMBODIMENTS

Figure 1:
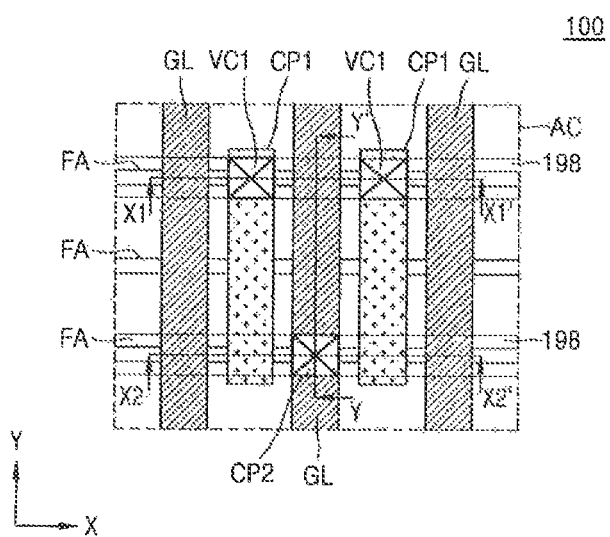
FIG. 1 is a plan view illustrating an integrated circuit device according to an exemplary embodiment of the inventive concept.

Exemplary embodiments of the inventive concept will be described more fully hereinafter with reference to accompanying drawings. However, the inventive concept may be embodied in various different forms and should not be construed as being limited to the exemplary embodiments set forth herein. Like reference numerals may refer to like elements throughout the specification.

Figure 2A:
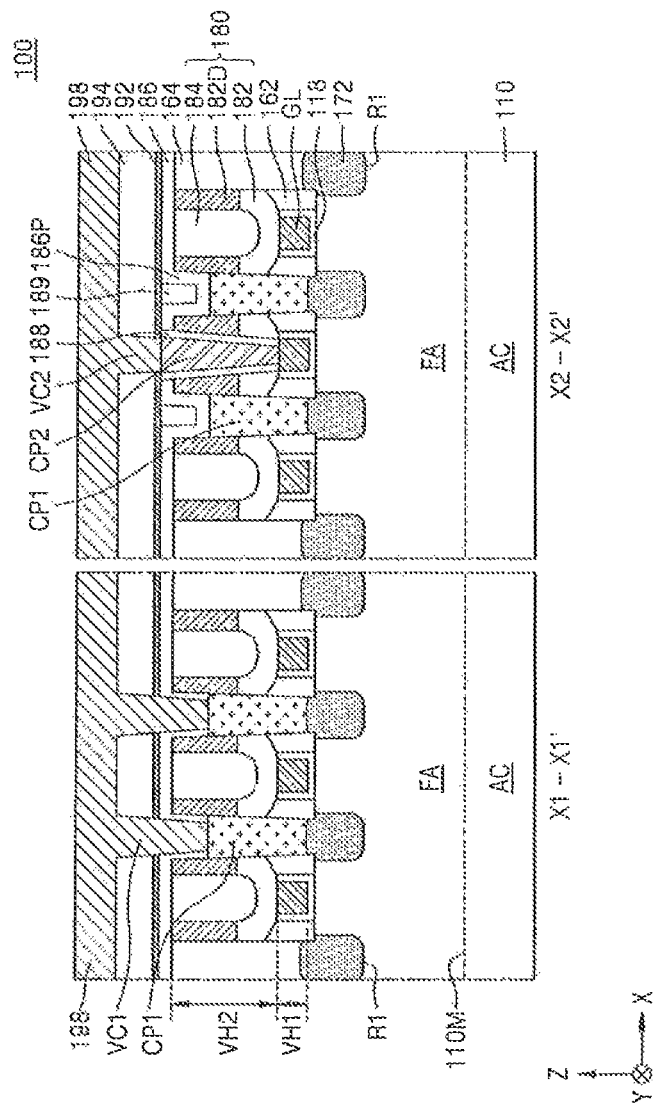
FIG. 2A is a cross-sectional view taken along lines X1-X1' and X2-X2' of FIG. 1 according to an exemplary embodiment of the inventive concept.
Figure 2B:
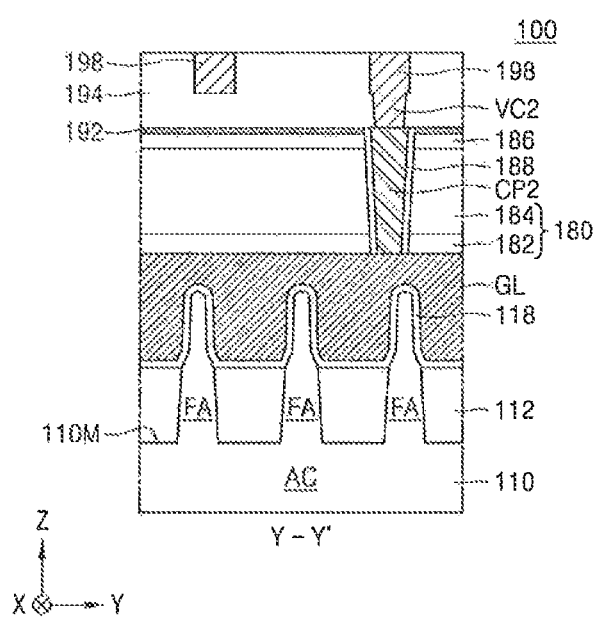
FIG. 2B is a cross-sectional view taken along line Y-Y' of FIG. 1 according to an exemplary embodiment of the inventive concept.

FIG. 1 is a plan view illustrating an integrated circuit device according to an exemplary embodiment of the inventive concept. FIG. 2A is a cross-sectional view taken along lines X1-X1' and X2-X2' of FIG. 1 according to an exemplary embodiment of the inventive concept. FIG. 2B is a cross-sectional view taken along line Y-Y' of FIG. 1 according to an exemplary embodiment of the inventive concept. An integrated circuit device 100, shown in FIGS. 1, 2A and 2B, may include a logic cell. The logic cell may include a fin field effect transistor (FinFET) according to an exemplary embodiment of the inventive concept.

Referring to FIGS. 1, 2A and 2B, a substrate 110 may have a main surface 110M extending in a horizontal plane (e.g., the horizontal plane may extend in an X direction and a Y direction of FIG. 1). The substrate 110 may include a device active region AC.

In an exemplary embodiment of the inventive concept, the substrate 110 may include a semiconductor material such as silicon (Si) or germanium (Ge), or a semiconductor compound such as silicon-germanium (SiGe), silicon carbide (SiC), gallium arsenide (GaAs), indium arsenide (InAs) or indium phosphide (InP). The substrate 110 may include a conductive region, for example, a well with doped impurities or a structure doped with impurities.

On the device active region AC, a plurality of fin-type active regions FA may protrude upward (e.g., in a Z direction) from the substrate 110. The fin-type active regions FA may extend in parallel along a direction (e.g., the X direction of FIG. 1). An isolation insulating layer 112 may be formed between each of the fin-type active regions FA on the device active region AC. The fin-type active regions FA may protrude in the Z direction above the isolation insulating layer 112.

A plurality of gate insulating layers 118 and a plurality of gate lines GL may extend on the substrate 110 in a direction (e.g., the Y direction of FIG. 1) crossing the fin-type active regions FA. The gate insulating layers 118 and the gate lines GL may cover a top surface and sidewalls of each of the fin-type active regions FA and a top surface of the isolation insulating layer 112.

A plurality of metal oxide semiconductor (MOS) transistors may be formed on the device active region AC along the gate lines GL. The MOS transistors may be three-dimensional MOS transistors, according to an exemplary embodiment of the inventive concept. Each of the MOS transistors has a channel that is formed on the top surface and sidewalls of each of the fin-type active regions FA.

The gate insulating layers 118 may include a silicon oxide layer, and/or a high-k dielectric layer. The high-k dielectric layer may include a material having a dielectric constant that is higher than a dielectric constant of the silicon oxide layer. For example, the gate insulating layers 118 may have a dielectric constant of about 10 to about 25. The high-k dielectric layer may include metal oxide or metal oxynitride. The high-k dielectric, layer may include hafnium oxide, hafnium oxynitride, hafnium silicon oxide, lanthanum oxide, lanthanum aluminum oxide, zirconium oxide, zirconium silicon oxide, tantalum oxide, and/or titanium oxide. However, the inventive concept is not limited thereto. In an exemplary embodiment of the inventive concept, an interface layer may be interposed between each of the fin-type active regions FA and each of the gate insulating layers 118. The interface layer may be an insulating layer such as an oxide layer, a nitride layer or an oxynitride layer.

The gate lines GL may each include a work function metal-containing layer and a gap-fill metal layer. The work function metal-containing layer may include titanium (Ti), tungsten (W), ruthenium (Ru), niobium (Nb), molybdenum (Mo), hafnium (H), nickel (Ni), cobalt (Co), platinum (Pt), ytterbium (Yb), terbium (Tb), dysprosium (Dy), erbium (Er) and/or palladium (Pd). The gap-fill metal layer may include tungsten (W) and/or aluminum (Al). In an exemplary embodiment of the inventive concept, the gate lines GL may each include a TiAlC/TiN/W stack structure, a TiN/TaN/TiAlC/TiN/W stack structure or a TiN/TaN/TiN/TiAlC/TiN/W stack structure. However, the inventive concept is not limited thereto.

An insulating spacer 162 may be disposed on opposite sidewalls of each of the gate lines GL. The insulating spacer 162 may cover theopposite sidewalls of each of the gate lines GL. The insulating spacer 162 may extend parallel to each of the gate lines GL along a length direction (e.g., the Y direction) of the gate lines GL. The insulating spacer 162 may include a silicon nitride layer, a silicon oxycarbonitride layer, and/or a silicon carbonitride layer. In an exemplary embodiment of the inventive concept, the insulating spacer 162 may include a material layer having a smaller dielectric constant than a dielectric constant of a silicon nitride layer. For example, the insulating spacer 162 may include a silicon oxycarbonitride layer, and/or a silicon carbonitride layer.

A plurality of complex capping layers 180 may be formed on the gate lines GL. The complex capping layers 180 may each include at least two layers including different compositions. The complex capping layers 180 may respectively vertically overlap the gate lines GL and the insulating spacer 162 and may extend parallel to the gate lines GL.

The complex capping layers 180 may each include a bottom capping layer 182 contacting the top surface of each gate line GL and a top surface of the insulating spacer 162 and extending parallel to each gate line GL, a core capping layer 184 disposed on the bottom capping layer 182, having a width less than a width of the bottom capping layer 182 in a length direction (e.g., the X direction) of the fin-type active regions FA and extending parallel to the bottom capping layer 182, and a sidewall capping layer 182D disposed on the bottom capping layer 182 and contacting a sidewall of the core capping layer 184. The bottom capping layer 182 may be disposed between each gate line GL and the core capping layer 184 overlapping the gate line GL, and between the insulating spacer 162 and the sidewall capping layer 182D. Referring to FIG. 2A, the complex capping layers 180 may respectively include two sidewall capping layers 182D covering opposite sidewalls of the core capping layer 184, on the bottom capping layer 182. The bottom capping layer 182 and the sidewall capping layer 182D of each complex capping layer 180 may form a semi-shell shape (or a horseshoe-shape) surrounding a portion of the core capping layer 184. In an exemplary embodiment of the inventive concept, the bottom capping layer 182 and the sidewall capping layer 182D may be integrally formed (e.g., are different portions/areas of the same structure).

At least two layers, from among the bottom capping layer 182, the core capping layer 184 and the sidewall capping layer 182D, may have different compositions with respect to each other. In an exemplary embodiment of the inventive concept, the bottom capping layer 182 and the core capping layer 184 may include a silicon nitride layer, and the sidewall capping layer 182D may include a doped silicon nitride layer. For example, the sidewall capping layer 182D may include a silicon nitride layer doped with B, Si, C, N, As, P, O, F, Ar, Ge, H and/or He. In the case in which the bottom capping layer 182 includes a silicon nitride layer and the sidewall capping layer 182D includes a silicon (Si) doped-silicon nitride layer, a silicon (Si) composition in the sidewall capping layer 182D may be greater than a silicon (Si) composition in the bottom capping layer 182. The sidewall capping layer 182D may have a high etch resistance compared to the bottom capping layer 182 and the core capping layer 184. Accordingly, under the same etch condition, for example, under an etch condition where an oxide layer is selectively etched, an etching amount of the sidewall capping layer 182D may be less than an etching amount of the bottom capping layer 182 and the core capping layer 184, or the sidewall capping layer 182D may not be etched.

In an exemplary embodiment of the inventive concept, a height VH2 of each of the complex capping layers 180 may be greater than a height VH1 of each of the gate lines GL in a vertical direction (e.g., a Z direction) with respect to the main surface 110M of the substrate 110.

An insulating liner 186 may cover the complex capping layers 180 and an inter-gate insulating layer 164. The insulating liner 186 may have a planarized top surface on the complex capping layers 180.

A plurality of source/drain regions 172 may be formed on the fin-type active regions FA at opposite sides of each of the gate lines GL. Each of the gate lines GL and each of the source/drain regions 172 may be spaced apart from each other with the gate insulating layer 118 and the insulating spacer 162 disposed therebetween. The source/drain regions 172 may each include an impurity-doped region formed in a portion of each of the fin-type active regions FA, and/or a semiconductor epitaxial layer growing from each of a plurality of recess regions R1. The recess regions R1 may be formed in each of the fin-type active regions FA. The source/drain regions 172 may include an epitaxial silicon (Si) layer, an epitaxial silicon carbide (SiC) layer or a plurality of epitaxial germanium (Ge) layers. When a transistor formed on each of the fin-type active regions FA is an N-type MOS (NMOS) transistor, the source/drain regions 172 may include an epitaxial silicon (Si) layer or an epitaxial silicon carbide (SiC) layer and may include N-type impurities. When a transistor formed on each of the fin-type active regions FA is a P-type MOS (PHOS) transistor, the source/drain regions 172 may include an epitaxial silicon germanium (SiGe) layer and may include P-type impurities.

Some of the plurality of source/drain regions 172 may be covered by the inter-gate insulating layer 164. The inter-gate insulating layer 164 may include a silicon oxide layer.

A plurality of first conductive plugs CP1 may be formed on the fin-type active regions FA to be connected to the source/drain regions 172, respectively. The first conductive plugs CP1 may each extend in a direction crossing the fin-type active regions FA. Referring to FIG. 1, the first conductive plugs CP1 may each cross three fin-type active regions FA in the Y direction on the three fin-type active regions FA. On each of the fin-type active regions FA, a top surface of each of the first conductive plugs CP1 may be positioned at a higher level than the top surface of each of the gate lines GL, with respect to the main surface 110M. In addition, on each of the fin-type active regions FA. The top surface of each of the first conductive plugs CP1 may be disposed at a lower level than a top surface of each of the complex capping layers 180 adjacent thereto, with respect to the main surface 110M. Each of the first conductive plugs CP1 may contact a pair of sidewalls of the complex capping layers 180 disposed at opposite sides of the first conductive plug CP1 in an extension direction (e.g., the X direction) at each fin-type active region FA. The top surface of each of the first conductive plugs CP1 may be positioned at a lower level than a top surface of the sidewall capping layer 182D, with respect to the main surface 110M.

The insulating liner 186 may include a plurality of pocket portions 186P extending downward (e.g., on the Z direction) toward the fin-type active regions FA to cover the first conductive plugs CP1. The pocket portions 186I may each have a shape protruding toward the substrate 110 to contact the top surface of each of the first conductive plugs CP1. A pocket region may be defined on the top surface of the insulating liner 186 by each of the pocket portions 186P. The pocket region may vertically overlap each of the first conductive plugs CP1 and may be filled with a pocket insulating layer 189. The insulating liner 186 and the pocket insulating layer 189 may include different insulating materials. For example, the insulating liner 186 may include a silicon nitride layer, and the pocket insulating layer 189 may include a silicon oxide layer.

The integrated circuit device 100 may include a second conductive plug CP2 connected to at least one of the gate lines GL. The second conductive plug CP2 may penetrate at least one of the complex capping layers 180 to contact the top surface of the at least one of the gate lines GL. A top surface of the second conductive plug CP2 may be positioned at a higher level than the top surface of each of the first conductive plugs CP1 and the top surface of each of the complex capping layers 180, with respect to the main surface 110M. Sidewalls of the second conductive plug CP2 may be covered by a pair of adjacent sidewall capping layers 182D included in a pair of complex capping layers 180. The pair of complex capping layers 180 may be disposed at opposite sides of the second conductive plug CP2 in the extension direction (e.g., the X direction) of the fin-type active regions FA. A sidewall capping layer 182D may be interposed between the second conductive plug CP2 and one of the first conductive plugs CP1 adjacent to the second conductive plug CP2. Thus, the likelihood of the occurrence of a short circuit between the first conductive plugs CP1 and the second conductive plug CP2 may be reduced or prevented.

The second conductive plug CP2 may be formed in a contact hole (e.g., a second contact hole CH2 in FIG. 4R) penetrating the complex capping layers 180 and the insulating liner 186. The second conductive plug CP2 may be surrounded by a plug insulating spacer 188 covering an inner sidewall of the contact hole. A portion of an upper portion of the second conductive plug CP2 may be surrounded by the insulating liner 186. In an exemplary embodiment of the inventive concept, the plug insulating spacer 188 may be omitted. In this case, the second conductive plug CP2 in the contact hole, penetrating the complex capping layer 180, may contact the bottom capping layer 182 and the sidewall capping layer 182D.

The integrated circuit device 100 may include a stopper insulating layer 192, an upper insulating layer 194, a plurality of first conductive via contacts VC1, a second conductive via contact VC2 and a plurality of interconnection layers 198. The stopper insulating layer 192 and the upper insulating layer 194 may be sequentially formed on the insulating liner 186 and the second conductive plug CP2. The first conductive via contacts VC1 may penetrate the upper insulating layer 194 and the stopper insulating layer 192 and may be connected to the first conductive plugs CP1, respectively. The second via contact VC2 may penetrate the upper insulating layer 194 and the stopper insulating layer 192 and may be connected to the second conductive plug CP2. The interconnection layers 198 may be formed on the upper insulating layer 194 to be connected to the first and second via contacts VC1 and VC2.

In an exemplary embodiment of the inventive concept, the first via contacts VC1 and some of the interconnection layers 198 may be integrally formed. The second via contact VC2 and some of the interconnection layers 198 may be integrally formed. The first and second via contacts VC1 and VC2 and the interconnection layers 198 may each include a metal layer and a conductive barrier layer surrounding the metal layer. The metal layer may include tungsten (W) or copper (Cu). The conductive barrier layer may include titanium (Ti), tantalum (Ta), titanium nitride (Ti), and/or tantalum nitride (TaN).

The stopper insulating layer 192 may include a stack layer of an aluminum nitride (AlN) layer and an oxygen-doped silicon carbide (SiC:O) layer. The stopper insulating layer 192 may be used as an etch stop layer during an etching process of the upper insulating layer 194 to form a contact hole in which the second via contact VC2 is positioned. In an exemplary embodiment of the inventive concept, the stopper insulating layer 192 may be omitted. The upper insulating layer 194 may include a silicon oxide layer. For example, the upper insulating layer 194 may include a tetraethyl orthosilicate (TEOS) layer or an Ultra low-k layer having an ultra low dielectric constant of about 2.2 to about 2.4. The ultra low-k layer may include a silicon oxycarbide (SiOC) layer or a hydrogenated silicon oxycarbide (SiCOH) layer.

As show in the cross-sectional view taken along line X2-X2' of FIG. 2A, since a height of the second conductive plug CP2 is greater than a height of each of the first conductive plugs CP1 on the fin-type active regions FA, an isolation distance in the vertical direction (e.g., the Z direction) between the second via contact VC2, connected to the second conductive plug CP2, and the first conductive plug CP1, adjacent to the second conductive plug CP2, may be obtained. A gap in the vertical direction between a bottom surface of the second conductive via contact VC2 and a top surface of the first conductive plug CP1 may be filled with the sidewall capping layer 182D, having an etch resistance. Accordingly, even when an undesired misalignment occurs during the etching of the upper insulating layer 194 to form the contact hole in which the second conductive via contact VC2 is positioned, a short circuit between the first conductive plug CP1 and the second via contact VC2 may be prevented by the sidewall capping layers 182D.

Figure 3:
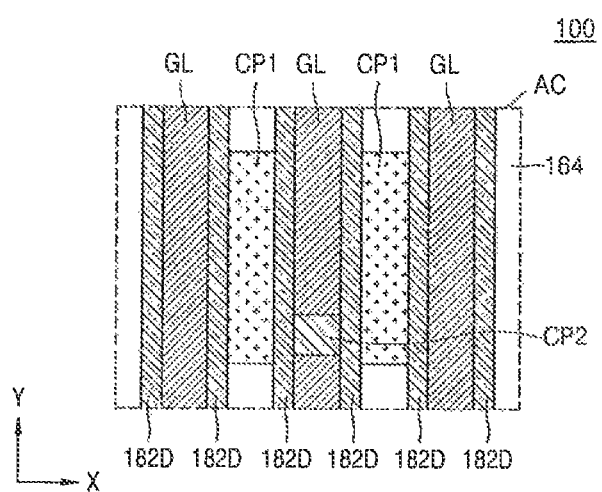
FIG. 3 is a plan view illustrating a configuration of the integrated circuit device shown in FIG. 1, according to an exemplary embodiment of the inventive concept.

FIG. 3 is a plan view illustrating a configuration of the integrated circuit device 100 shown in FIG. 1, according to an exemplary embodiment of the inventive concept.

Referring to FIG. 3, the plurality of gate lines GL, the plurality of sidewall capping layers 182D, the plurality of first conductive plugs CP1 and the second conductive plug CP2 may be disposed on the device active region AC.

The sidewall capping layers 182D included in the complex capping layers 180 may have a line shape extending along the length direction of the gate lines GL across an entire length of the gate lines GL, and may be positioned on opposite sides of the respective gate lines GL. The first conductive plugs CP1 may each contact two adjacent sidewall capping layers 182D.

Figure 4A:
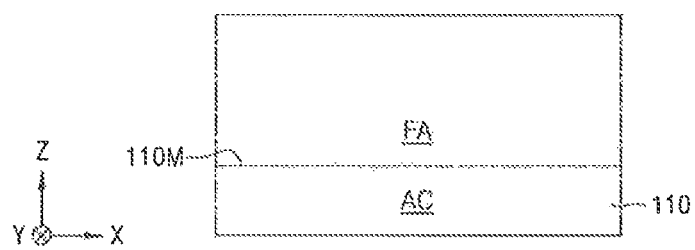
FIGS. 4A through 4W are cross-sectional views illustrating stages of a method of manufacturing an integrated circuit device, according to an exemplary embodiment of the inventive concept.
Figure 4B:
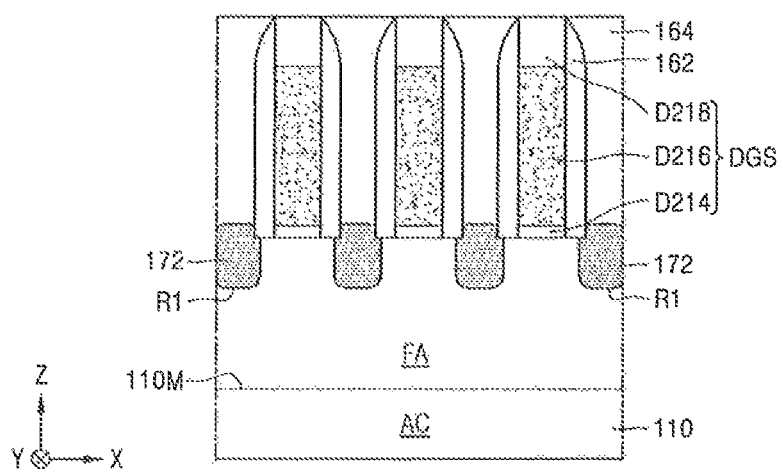
Figure 4C:
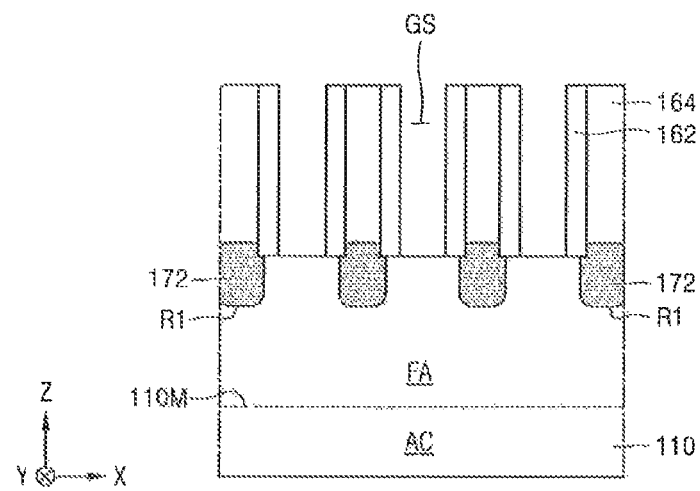
Figure 4D:
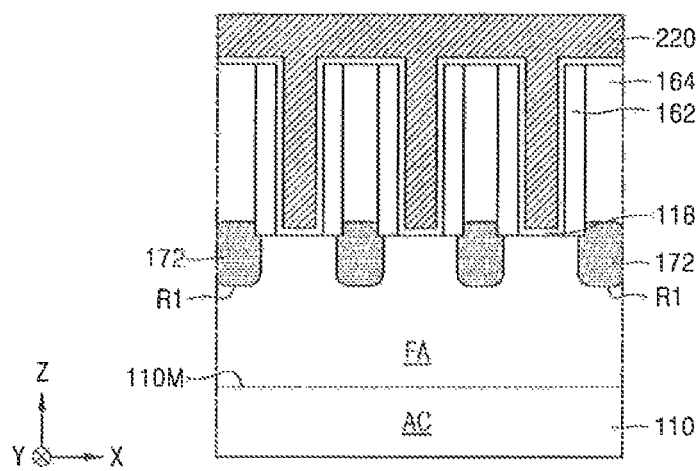
Figure 4E:
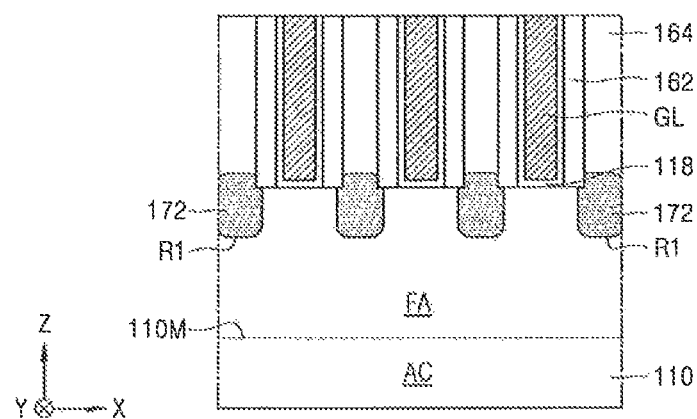
Figure 4F:
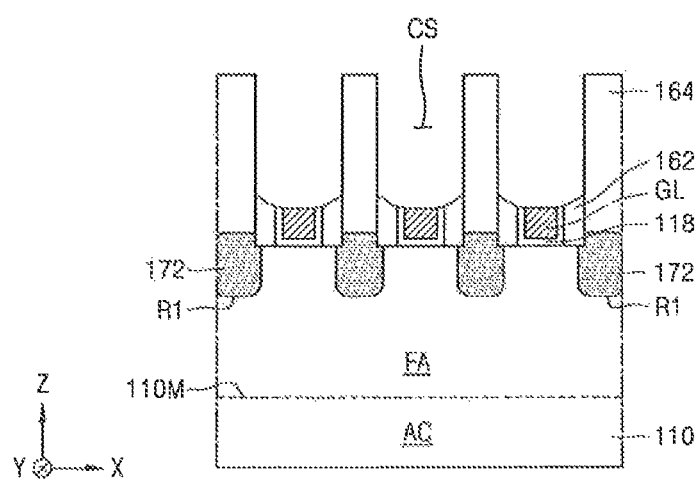
Figure 4G:
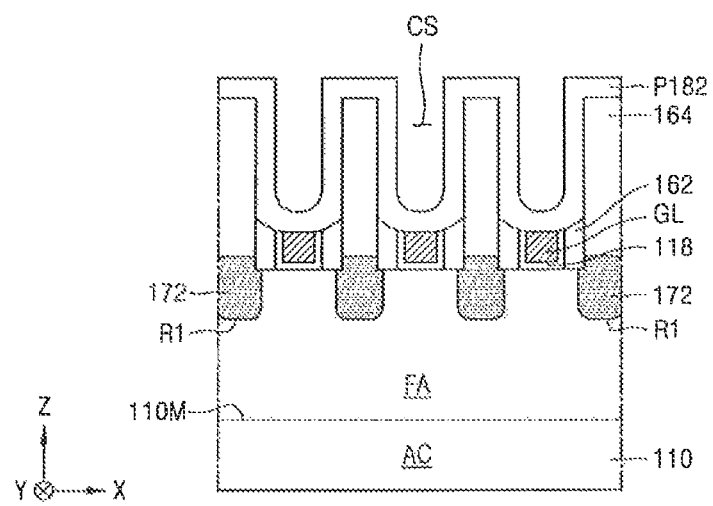
Figure 4H:
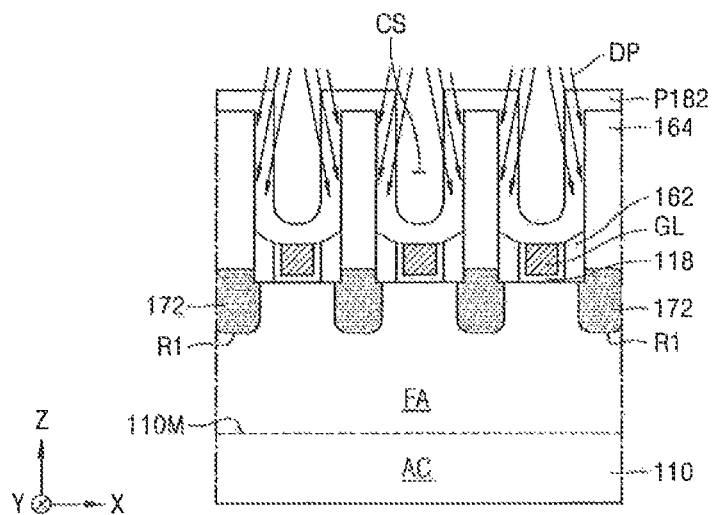
Figure 4I:
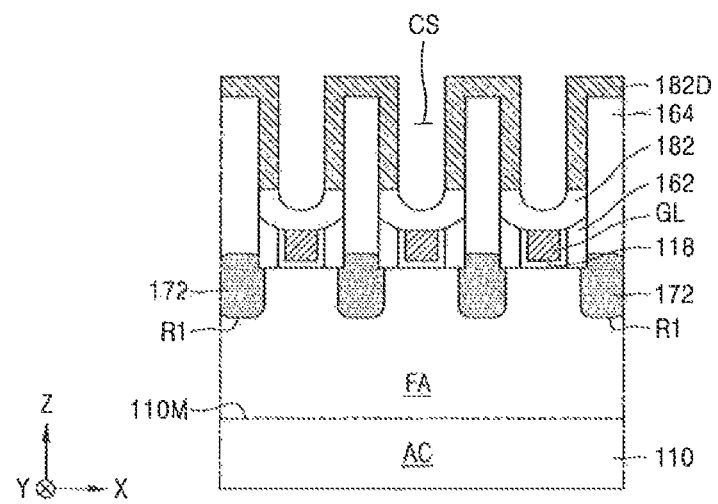
Figure 4J:
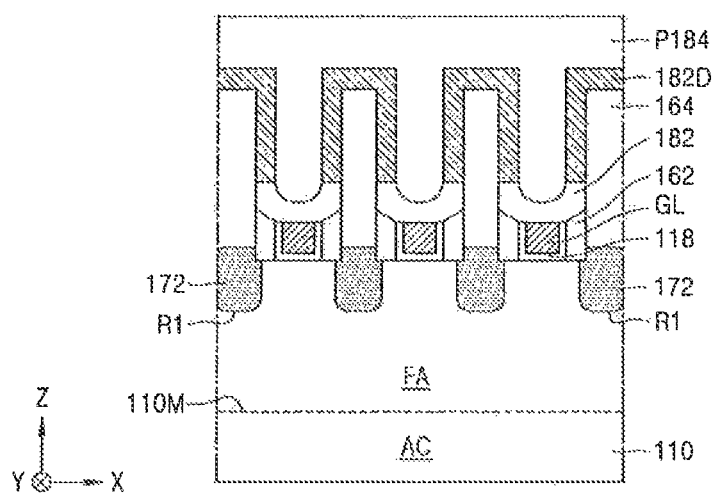
Figure 4K:
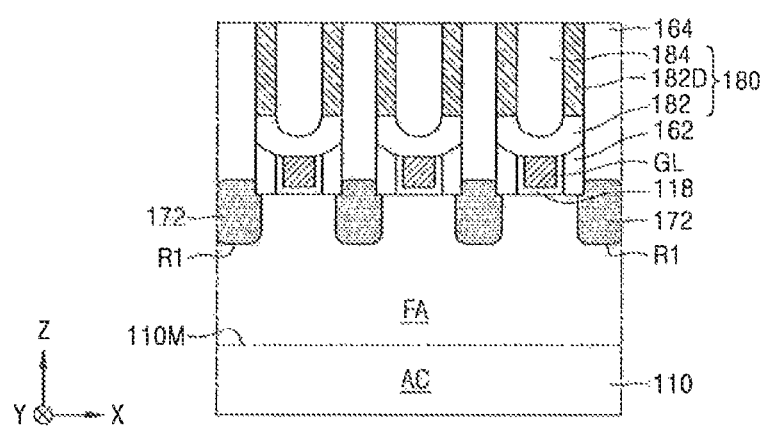
Figure 4L:
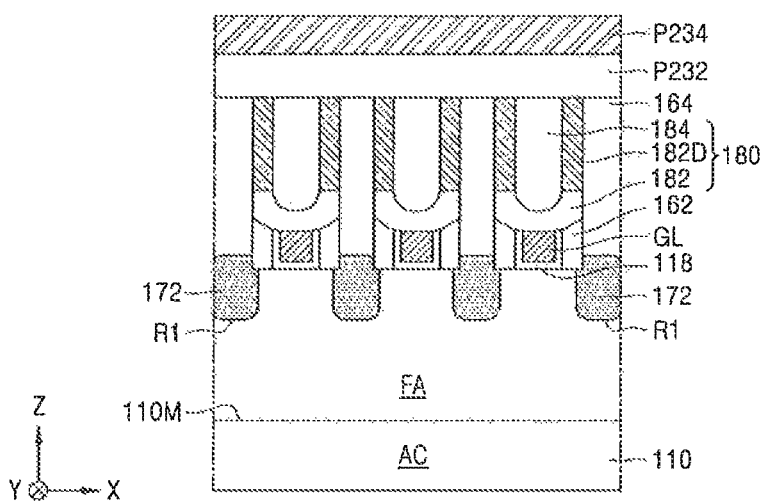
Figure 4M:
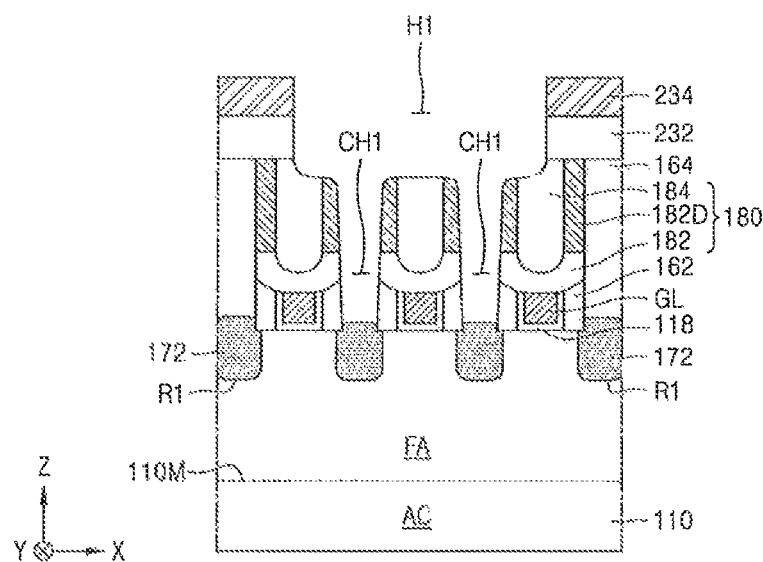
Figure 4N:
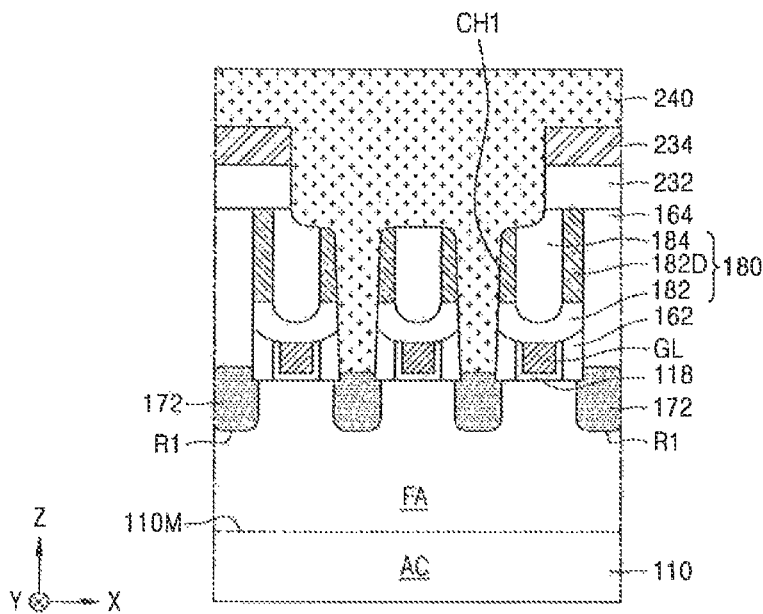
Figure 4O:
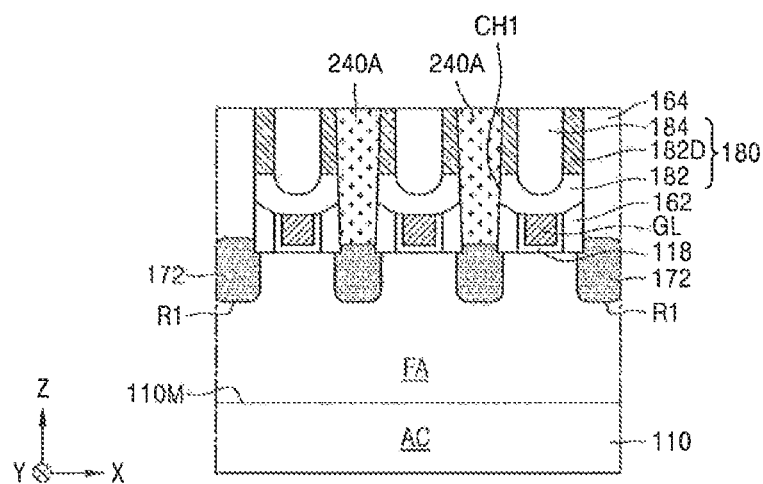
Figure 4P:
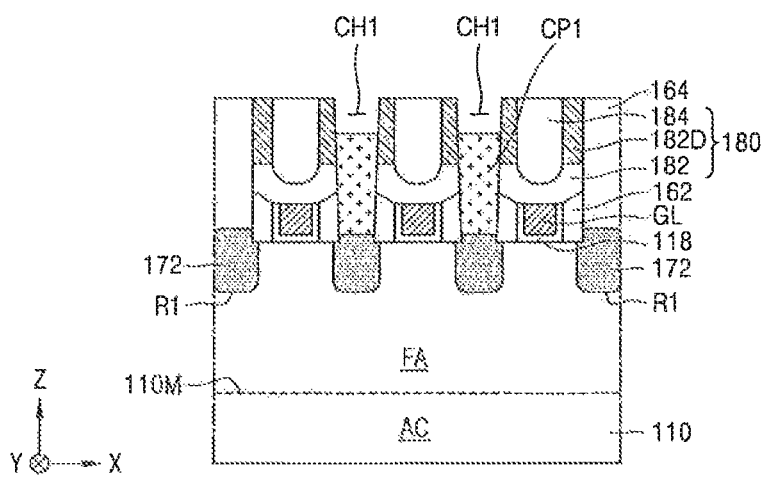
Figure 4Q:
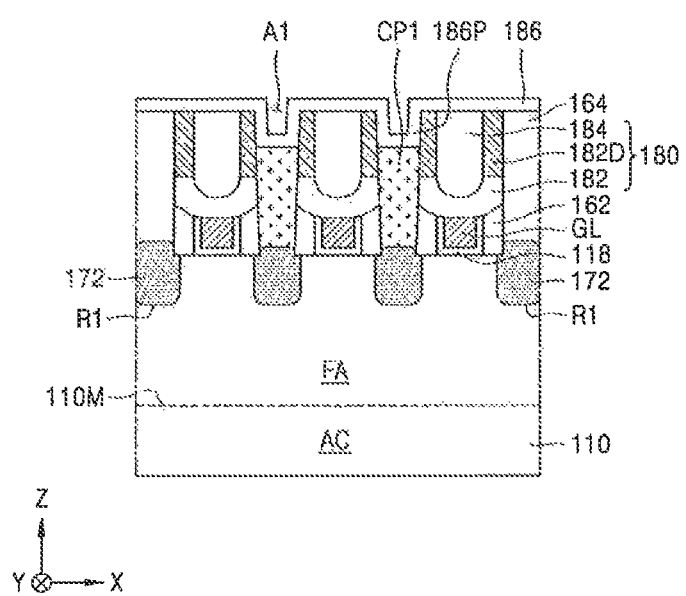
Figure 4R:
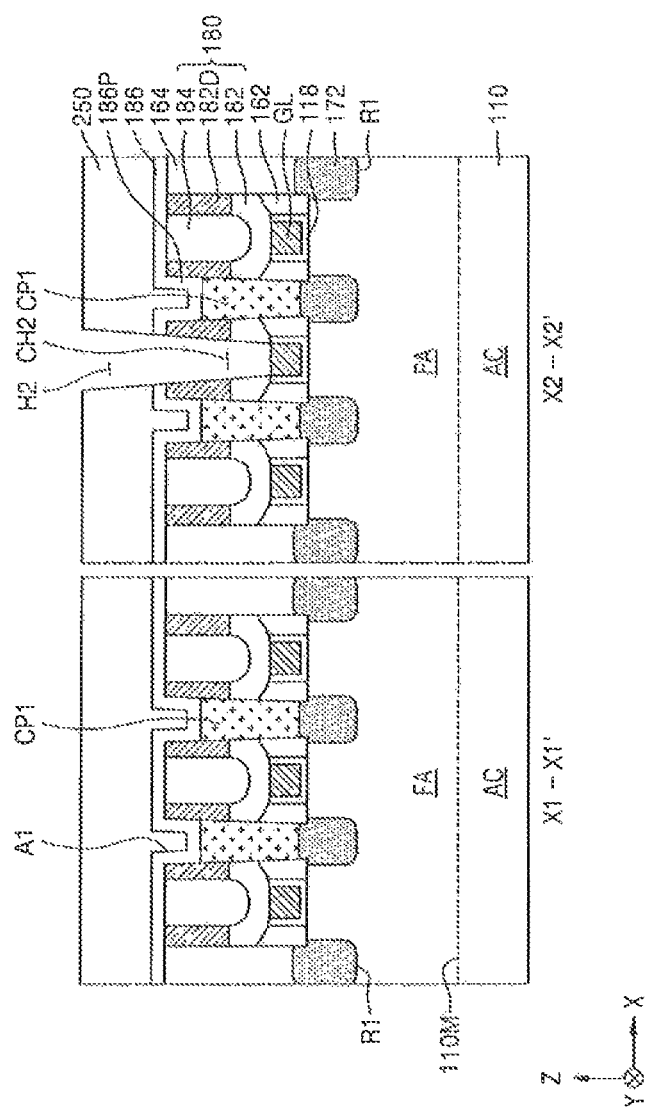
Figure 4S:
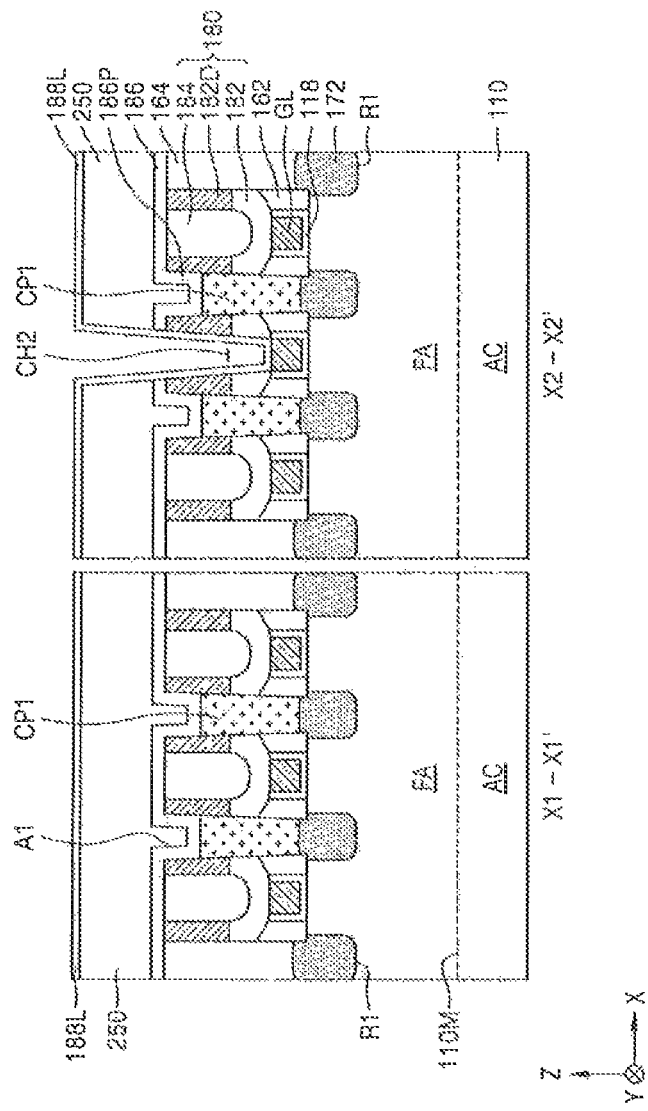
Figure 4T:
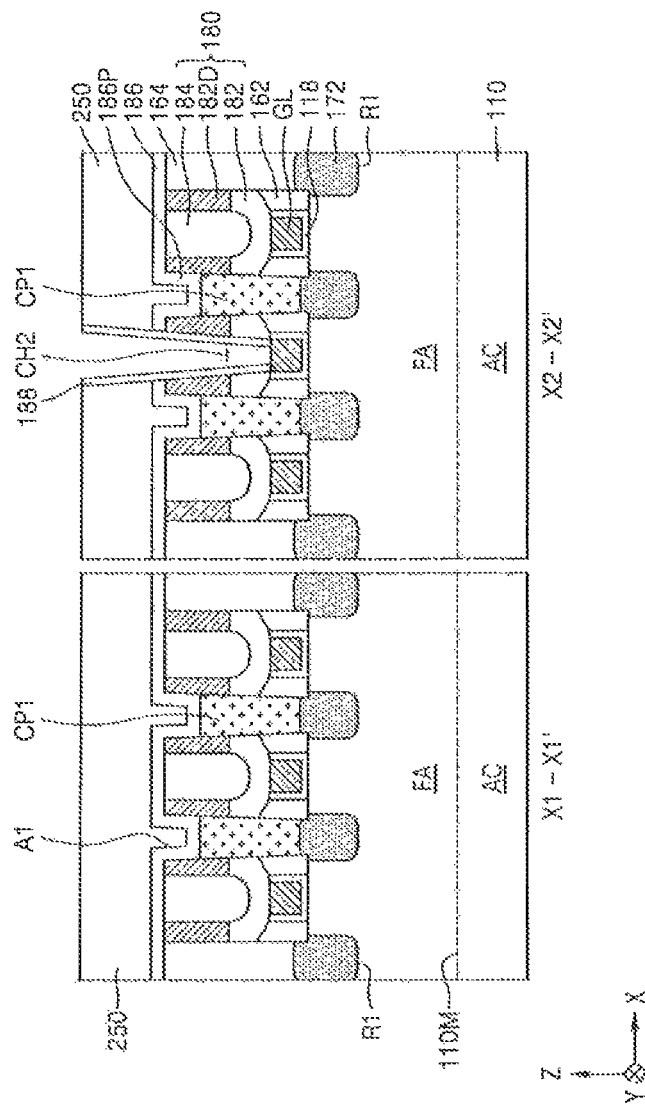
Figure 4U:
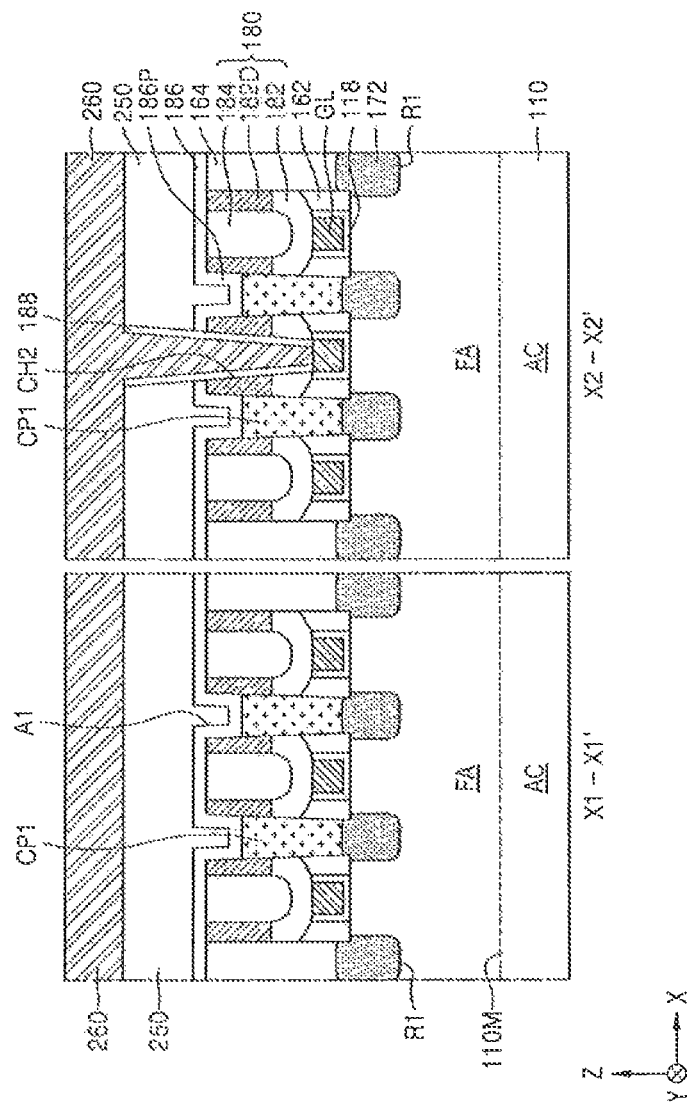
Figure 4V:
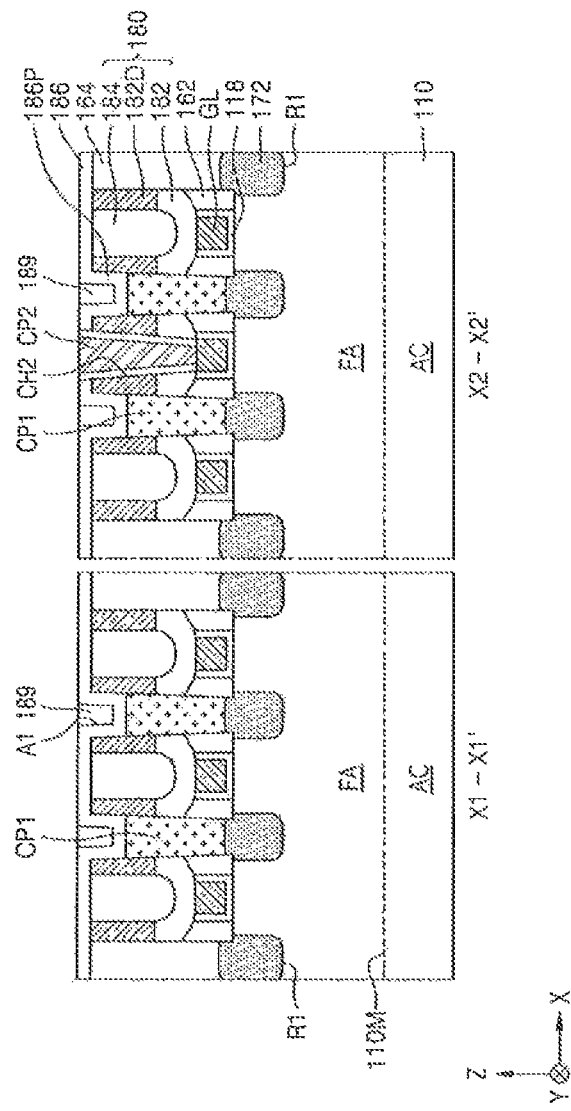
Figure 4W:
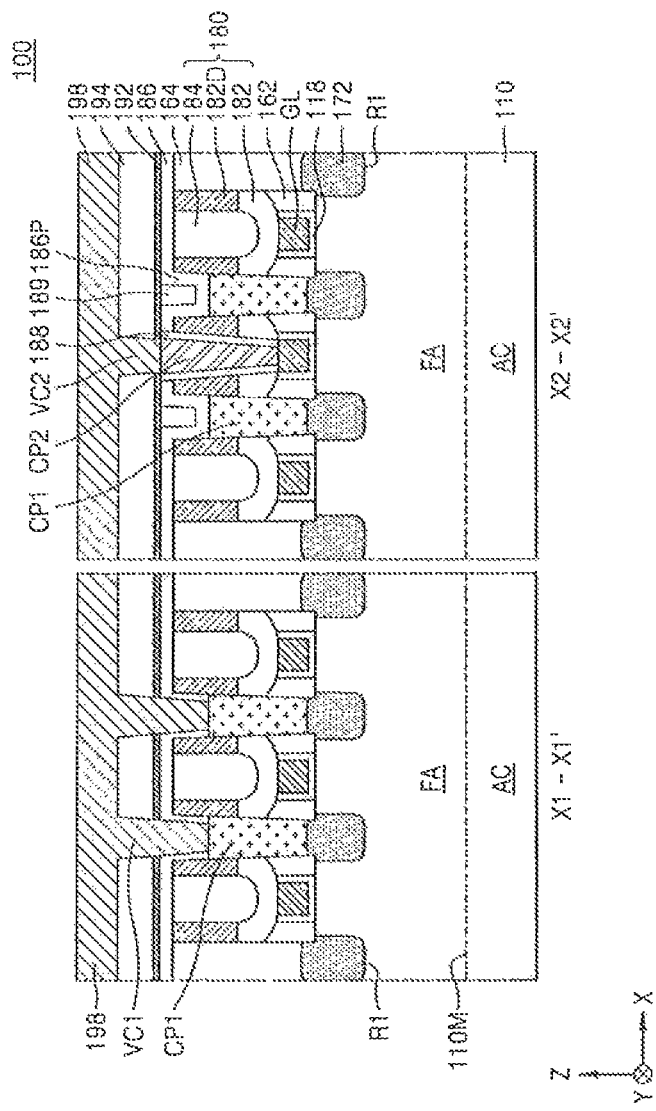

FIGS. 4A through 4W are cross-sectional views illustrating stages of a method of manufacturing an integrated circuit device 100, according to an exemplary embodiment of the inventive concept. With reference to FIGS. 4A through 4W, a method of manufacturing the integrated circuit device 100 shown in FIGS. 1 through 3 is described.

Referring to FIG. 4A, a portion of a device active region AC of a substrate 110 may be etched to form a fin-type active region FA that protrudes upward in a vertical direction (e.g., a Z direction) from a main surface 110M of the substrate 110, and extend in a direction (e.g., an X direction). The fin-type active region FA may have a cross-section structure as shown in FIG. 2A. A plurality of fin-type active regions FA may be formed on the device active region AC.

The active region AC of the substrate 110 may be a region on which a PMOS transistor or an NMOS transistor is formed.

An isolation insulating layer 112 (refer to FIG. 2B) may be formed on the substrate 110 to cover opposite sidewalls of a lower portion of the fin-active region FA. The fin-type active region FA may protrude above the isolation insulating layer 112.

Referring to FIG. 4B, a plurality of dummy gate structure DGS may be formed on the fin-type active region FA, and may cross the fin-type active region FA.

The plurality of dummy gate structures DGS may each include a dummy gate insulating layer D214, a dummy gate line D216 and a dummy gate capping layer D218 that are sequentially stacked on the fin-type active region FA. The dummy gate insulating layer D214 may include silicon oxide. The dummy gate line D216 may include polysilicon. The dummy gate capping layer D218 may include at least one of silicon oxide, silicon nitride and silicon oxynitride.

An insulating spacer 162 may be formed on opposite sidewalls of each of the dummy gate structures DGS. The insulating spacer 162 may be formed using an atomic layer deposition (ALD) process or a chemical vapor deposition (CVD) process.

A portion of the fin-type active region FA exposed at opposite sides of each of the dummy gate structures DGS may be etched to form a plurality of recess regions R1. A plurality of source/drain regions 172 may be formed by epitaxially growing semiconductor layers from the plurality of recess regions R1. The source/drain regions 172 may each have a top surface positioned at a higher level than a top surface of the fin-type active region FA. However, the inventive concept is not limited thereto.

An inter-gate insulating layer 164 may be formed by forming an insulating layer having a thickness large enough to cover the source/drain regions 172, the dummy gate structures DGS and the insulating spacer 162, and then planarizing the resulting structure having the insulating layer to expose a top surface of the dummy gate capping layer D218.

Referring to FIG. 4C, the dummy gate structures DGS may be removed from the resulting structure of FIG. 4B to for a plurality of gate spaces GS. The insulating spacer 162, the fin-type active region FA and the isolation insulating layer 112 (refer to FIG. 2B) may be exposed through the gate spaces GS.

The dummy gate structures DGS may be removed by a wet etching process. The wet etching process may be performed using an etchant including nitric acid ($HNO_3$), diluted fluoric acid (DHF), ammonia ($NH_4OH$), tetramethyl ammonium hydroxide (TMAH), and/or potassium hydroxide (KOH).

Referring to FIG. 4D, a gate insulating layer 118 and a gate conductive layer 220 may be formed in the gate spaces GS. Before forming the gate insulating layer 118, an interface layer may be further formed on a surface of the fin-type active region FA, exposed through the gate spaces GS. The interface layer may be formed by oxidizing a portion of the fin-type active region FA exposed in the gate spaces GS.

The gate insulating layer 118 and the gate conductive layer 220 may be formed to fill the gate spaces GS and cover a top surface of the inter-gate insulating layer 164. The gate insulating layer 118 and the gate conductive layer 220 may be formed by an atomic layer deposition (ALD) process, a chemical vapor deposition (CVD) process, a physical vapor deposition (PVD) process, a metal organic AHD (MOALD) process or a MOCVD process.

Referring to FIG. 4E, portions of the gate insulating layer 118 and the gate conductive layer 220 may be removed to expose the top surface of the inter-gate insulating layer 164 such that a plurality of gate insulating layer 118 and a plurality of gate lines GL may remain in the gate spaces GS, respectively.

Referring to FIG. 4F, an upper portion of each of the gate lines GL, an upper portion of each of the gate insulating layers 118 and an upper portion of the insulating spacer 162 may be etched to form a plurality of capping spaces CS on the gate lines GS, respectively. A width of each of the capping spaces CS may be defined by the spacing of adjacent inter-gate insulating layers 164.

In the etching process for forming the capping spaces CS, an etch rate of the gate lines GL and an etch rate of the insulating spacer 162 may be adjusted such that a top surface of the insulating spacer 162 may be positioned at a higher level than a top surface of each of the gate lines GL. A height of the insulating spacer 162 may be increased in a direction away from each of the gate lines GL (e.g., in a direction away from the center of a gate line GL) in each of the capping spaces CS. A bottom surface of each of the capping spaces CS may have a rounded cross-section profile having the lowest level at each of the gate lines GL (e.g., at a center of a gate line GL).

When the insulating spacer 162 includes a material layer having a dielectric constant smaller than a dielectric constant of a silicon nitride layer, for example, a silicon oxycarbonitride (SiOCN) layer, and/or a silicon carbonitride (SiCN) layer, opposite sidewalls of each of the gate lines GL may be covered to a sufficiently height by the insulating spacer 162 having a low-k dielectric material. Thus, an undesired parasitic capacitance between the gate lines GL and a conductive structure to be formed adjacent to each of the gate lines GL may be reduced or prevented from being generated. The conductive structure to be formed adjacent to each of the gate lines GL may be, for example, a first conductive plug CP1.

Referring to FIG. 4G, a first capping layer P182 may be formed to conformally cover inner surfaces of the capping spaces CS and the top surface of the inter-gate insulating layer 164.

An empty space may remain on the first capping layer P182 in each of the capping spaces CS after forming the first capping layer P182. The first capping layer P182 may include a silicon nitride layer.

Referring to FIG. 4H, an oblique ion implantation process may be performed to selectively implant dopants DP in an upper portion of the first capping layer P182. The dopants DP may include B, Si, C, N, As, P, O, F, Ge, H and/or He atoms.

Referring to FIG. 4I, after performing the oblique ion implantation process, the first capping layer P182 may include a lower portion that contacts the gate lines GL, the gate insulating layers 118 and the insulating spacer 162 in the capping space CS. The lower portion of the first capping layer P182 may be not injected with the dopants DP and the upper portion of the first capping layer P182 may be injected by the dopants DP. The lower portion of the first capping layer P182 may form a bottom capping layer 182, and the upper portion of the first capping layer P182 may form a sidewall capping layer 182D, which includes of a doped insulating layer.

Referring to FIG. 4J, a second capping layer P184 may be formed to fill the remaining capping spaces CS. The second capping layer P184 may include a silicon nitride layer.

Referring to FIG. 4K, the first capping layer P182 and the second capping layer P184 may be partially removed by a chemical mechanical polishing process (CMP) process to expose the top surface of the inter-gate insulating layer 164. As a result, a portion of the second capping layer P184, filling each of the capping spaces CS, may form a core capping layer 184. Thus, the bottom capping layer 182, the sidewall capping layer 182D and the core capping layer 184 may form a complex capping layer 180.

Referring to FIG. 4L, a first hard mask layer P232 and a second hard mask layer P234 may be formed to cover the complex capping layer 180 and the inter-gate insulating layer 164. In an exemplary embodiment of the inventive concept, the first hard mask layer P232 may include a silicon oxide layer, for example, a TEOS layer, and the second hard mask layer 234P may include a metal nitride layer, for example, a titanium nitride (TiN) layer.

Referring to FIG. 4M, the first hard mask layer P232 and the second hard mask layer P234 may be patterned to form a first hard mask pattern 232 and a second hard mask pattern 234. The first and second hard mask patterns 232 and 234 may include a first opening H1, exposing portions of the inter-gate insulating layer 164 corresponding to a region in which a plurality of first conductive plugs CP1 (refer to FIGS. 1 and 2A) will be formed and portions of the complex capping layer 180. The inter-gate insulating layer 164, exposed by the first opening H1, may be etched using the first and second hard mask layers 232 and 234 as an etch mask and using a difference in an etch selectivity between the inter-gate insulating layer 164 and the complex capping layer 180. Thus, a plurality of first contact holes CH1, self-aligned by the complex capping layer 180, may be formed. Since the sidewall capping layer 182D of the complex capping layer 180 is doped with the dopants DP to have an increased etch resistance, the sidewall capping layer 182D, exposed by the first contact holes CH1, may be etched a little or may not be etched or consumed by the etching atmosphere during the forming of the first contact holes CH1, self-aligned by the sidewall capping layer 182D. Thus, the first contact holes CH1 may be formed at positions which are separated from the gate lines GL and in positions in which the gate lines GL are isolated from the first contact holes CH1.

Referring to FIG. 4N, a first conductive layer 240 may be formed with a thickness large enough to fill the first contact holes CH1. The first conductive layer 240 may include a stack structure of a conductive barrier layer and a metal layer. The metal layer may include tungsten (W) or copper (Cu). The conductive barrier layer may include titanium (Ti), tantalum (Ta), titanium nitride (Ti), and/or tantalum nitride (TaN).

Referring to FIG. 4O, a planarization process may be performed on the first conductive layer 240, the first hard mask pattern 232 and the second hard mask pattern 234 to expose the top surface of the inter-gate insulating layer 164. A portion of the first conductive layer 240, the first and second hard mask patterns 232 and 234, a portion of the inter-gate insulating layer 164 and a portion of the complex capping layer 180 may be removed together. As a result, a plurality of preliminary first conductive plugs 240A may be formed to fill the first contact holes CH1, respectively. Top surfaces of the preliminary first conductive plugs 240A may be substantially coplanar with the top surface of the complex capping layer 180.

Referring to FIG. 4P, the preliminary first conductive plugs 240A may be selectively etched-back to a predetermined depth using an etch selectivity of the preliminary first conductive plugs 240A with respect to the complex capping layer 180 and the inter-gate insulating layer 164 such that a plurality of first conductive plugs CP1 may be formed to have a reduced height. Upper portions of the first contact holes CH1 may remain as empty spaces on the first conductive plugs CP1.

Referring to FIG. 4Q, an insulating liner 186 may be formed to conformally cover the resulting structure of FIG. 4P. The insulating liner 186 may include a plurality of pocket portions 186P that conformally cover top surfaces of the first conductive plugs CP1 and inner surfaces of the upper portions of the first contact holes CH1. The pocket portions 186P may contact a sidewall of the complex capping layer 180. A plurality of pocket regions A1 may be defined on a top surface of the insulating liner 186 by the pocket portions 186P.

FIGS. 4R through 4W are cross-sectional views taken along lines X1-X1' and X2-X2' of FIG. 1.

Referring to FIG. 4R, a third hard mask pattern 250 including a second opening H2 may be formed on the complex capping layer 180. The second opening H2 may expose a portion of the insulating liner 186 overlapped with a portion of the complex capping layer 180 in which a second plug CP2 (refer to FIG. 4V) will be formed.

The exposed insulating liner 186 and the complex capping layer 180 disposed under the insulating liner 186 may be etched using the third hard mask pattern 250 as an etch mask to form a second contact hole CH2. The second contact hole CH2 may expose at least one of the gate lines GL. Since the sidewall capping layer 182D of the complex capping layer 180 may have a high etch resistance compared to the core capping layer 184 and the bottom capping layer 182, a consumption (e.g., etching) of the sidewall capping layer 182D may be suppressed during the formation of the second contact hole CH2. Thus, the second contact hole CH2 may be formed at a desired position without being misaligned. Accordingly, the second contact hole CH2 may be formed at a position which is spaced apart from adjacent first conductive plugs CP1 and is isolated from adjacent first conductive plugs CP1.

Referring to FIG. 4S, an insulating layer 188L may be formed to conformally cover the complex capping layer 180 exposed by the second contact hole CH2. The insulating layer 188L may be formed to conformally cover an exposed inner surface of the second contact hole CH2 and an exposed surface of the third hard mask pattern 250. The insulating layer 188L may include a silicon nitride layer.

Referring to FIG. 4T, the insulating layer 188L may be etched-back to remove a portion of the insulating layer 188L disposed outside the second contact hole CH2 and a portion of the insulating layer 188L covering the gate line GL in the second contact hole CH2. As a result, a portion of the insulating layer 188L may remain on inner sidewalls of the second contact hole CH2 to form a plug insulating spacer 188, covering the inner sidewalls of the second contact hole CH2 and exposing the gate line GL through the second contact hole CH2.

Referring to FIG. 4U, a second conductive layer 260 may be formed with a thickness large enough to fill the second contact hole CH2. The second conductive layer 260 may include a stack structure of a conductive barrier layer and a metal layer. The conductive barrier layer and the metal layer may be the same as the conductive barrier layer and the metal layer of the first conductive layer 240 of FIG. 4N.

Referring to FIG. 4V, the resulting structure of FIG. 4U may be planarized to expose a top surface of the insulating liner 186. The second conductive layer 260 and the third hard mask pattern 250 may be partially removed by a CMP process. As a result, a portion of the third hard mask pattern 250, filling the pocket regions A1 on the insulating liner 186, may form a pocket insulating layer 189. Additionally, a portion of the second conductive layer 260, filling the second contact hole CH2, may form a second conductive plug CP2.

The top surface of the insulating liner 186, a top surface of the pocket insulating layer 189 and a top surface of the second conductive plug CP2 may be substantially coplanar with each other.

Referring to FIG. 4W, a stopper insulating layer 192 and an upper insulating layer 194 may be sequentially formed on the insulating liner 186, the pocket insulating layer 189 and the second conductive plug CP2. A plurality of first conductive via contacts VC1 may be formed to penetrate the upper insulating layer 194, the stopper insulating layer 192, the pocket insulating layer 189 and the pocket portion 186P of the insulating liner 186 and to be connected to the first conductive plugs CP1, respectively. A second conductive via contact VC2 may be formed to penetrate the upper insulating layer 194 and the stopper layer 192 and be connected to the second conductive plug CP2. A plurality of interconnection layers 198 may be formed on the upper insulating layer 194 to be connected to the first and second conductive via contacts VC1 and VC2. The interconnection layers 198 may extend in a direction parallel to an extension direction of the fin-type active region FA.

A photolithography process and an etching process for forming first holes in which the first conductive via contacts VC1 are respectively positioned may be performed either separately from or simultaneously with a photolithography process and an etching process for forming a second hole in which the second conductive via contact VC2 is positioned.

In the etching process for forming the first and/or second holes, the stopper insulating layer 192 may be used as an etch stop layer. In an exemplary embodiment of the inventive concept, the stopper insulating layer 192 may be omitted. In this case the insulating liner 186 may be used as an etch stop layer during the etching process for forming the first and/or second holes.

Figure 5:
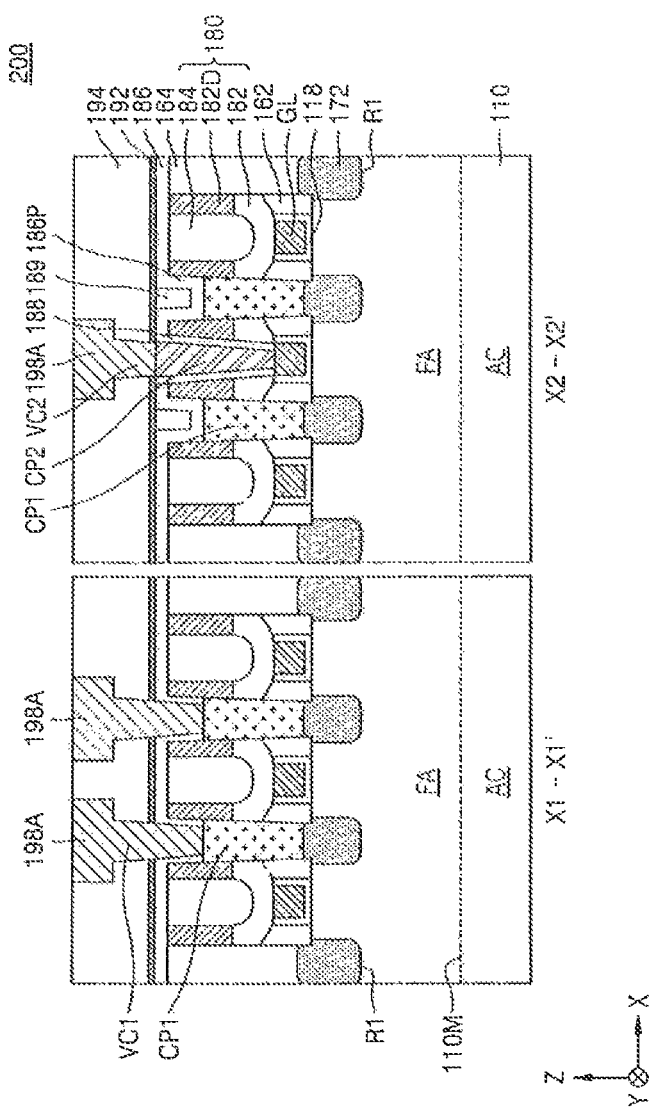
FIG. 5 is a cross-sectional view illustrating an integrated circuit device according to an exemplary embodiment of the inventive concept.

FIG. 5 is a cross-sectional view illustrating an integrated circuit device according to an exemplary embodiment of the inventive concept. An integrated circuit device 200 shown in FIG. 5 may be substantially the same as the integrated circuit device 100 shown in FIGS. 1 through 3. However, a plurality of first conductive via contacts VC1 may be connected to different interconnection layers 198A, respectively. At least some of the interconnection layers 198A may extend in a direction crossing the fin-type active region FA.

Figure 6:
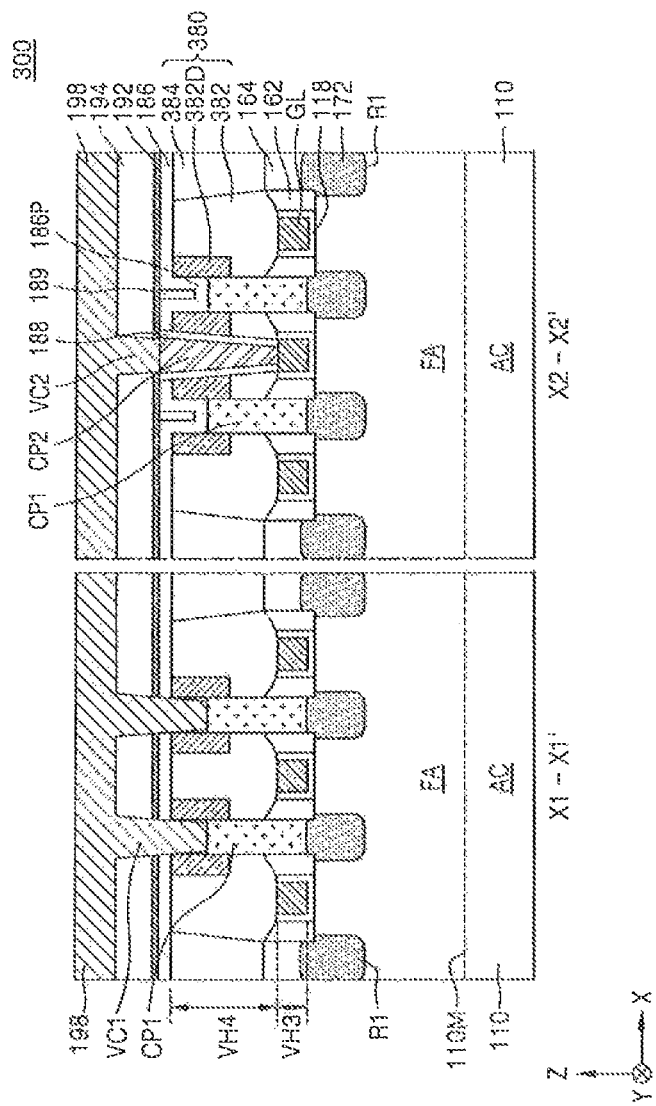
FIG. 6 is a cross-sectional view illustrating an integrated circuit device according to an exemplary embodiment of the inventive concept.

FIG. 6 is a cross-sectional view illustrating an integrated circuit device according to an exemplary embodiment of the inventive concept. FIG. 6 illustrates cross-sections taken along lines X1-X1' and X2-X2' of FIG. 1. An integrated circuit device 300 shown in FIG. 6 may be a logic cell including a FinFET device.

Referring to FIG. 6, a plurality of complex capping layer 380, each of which includes at least two layers having different compositions, may be formed on a plurality of gate lines GL, respectively. Each of the complex capping layers 380 may vertically overlap a gate line GL, an insulating spacer 162 covering opposite sidewalls of the gate line GL and an inter-gate insulating layer 164, respectively.

The complex capping layers 380 may each include a core capping layer 382, a sidewall capping layer 382D and an inter-gate capping layer 384.

The core capping layer 382 may extend parallel to the gate lines GL and may cover each of the gate lines GL and the insulating spacer 162. The core capping layer 382 may contact a top surface of each of the gate lines GL and a top surface of the insulating spacer 162. A contact region including a plurality of first conductive plugs CP1 may be provided on a device active region AC of a substrate 110. The sidewall capping layer 382D may be formed in the contact region on the device active region AC. The sidewall capping layer 382D may be formed on at least one sidewall of the core capping layer 382 in the contact region and may contact sidewalls of each of the first conductive plugs CP1. The core capping layer 382 may be integrally formed with the sidewall capping layer 382D. The inter-gate capping layer 384 may be formed on the inter-gate insulating layer 164 between each of the gate lines GL and may contact the inter-gate insulating layer 164 and the core capping layer 382. The inter-gate capping layer 384 may vertically overlap a source/drain region 172 with the inter-gate insulating layer 164 disposed therebetween.

At least two of the core capping layer 382, the sidewall capping layer 382D and the inter-gate capping layer 384 may have different compositions. In an exemplary embodiment of the inventive concept, the core capping layer 382 and the inter-gate capping layer 384 may include a silicon nitride layer, and the sidewall capping layer 382D may include a doped silicon nitride layer. In an exemplary embodiment of the inventive concept, a configuration of the sidewall capping layer 382D may be substantially the same as the configuration of the sidewall capping layer 182D shown in FIGS. 1 through 3.

In an exemplary embodiment of the inventive concept, a height VH4 of the complex capping layer 380 may be greater than a height VH3 of the gate lines GL, in a direction (e.g., a Z direction) vertical to a main surface 110M of the substrate 110.

The complex capping layer 380 may be covered by an insulating liner 186. The inter-gate insulating layer 164 may be spaced apart from the insulating liner 186 with the inter-gate capping layer 384 disposed therebetween.

Each of a plurality of first conductive plugs CP1 may contact a pair of the sidewall capping layers 382D included in a pair of the complex capping layer 380 adjacent to opposite sidewalls of the first conductive plug CP1 in an extension direction (e.g., an X direction) of a fin-type active region FA.

A second conductive plug CP2 may penetrate the core capping layer 382 to contact the top surface of any one of the gate lines GL. A top surface of the second conductive plug CP2 may be positioned at a higher level than a top surface of each of the first conductive plug CP1 and at a higher level than a top surface of the complex capping layer 180, with respect to the main surface 110M. Opposite sidewalls of the second conductive plug CP2 may be covered by a pair of sidewall capping layers 382D included in a pair of the complex capping layer 380 adjacent to the opposite sidewalls of the second conductive plug CP1 in the extension direction (e.g., the X direction) of a fin-type active region FA. The pair of the sidewall capping layers 382D, covering the opposite sidewalls of the second conductive plug CP2, may each be interposed between the second conductive plug CP2 and one of the first conductive plugs CP1. Thus, the likelihood of the occurrence of a short circuit between the first conductive plugs CP1 and the second conductive plug CP2 may be reduced or prevented.

A plug insulating spacer 188 may surround sidewalls of the second conductive plug CP2. The plug insulating spacer 188 may extend from the insulating liner 186 toward the gate line GL through the complex capping layer 380 to cover the sidewalls of the second conductive plug CP2. In an exemplary embodiment of the inventive concept, the plug insulating spacer 188 may be omitted. In this case, the second conductive plug P2 may contact the core capping layer 382 and the sidewall capping layer 382D in a contact hole (refer to a second contact hole CH2 of FIG. 8O) penetrating the complex capping layer 180.

As shown in the cross-section view taken along line X2-X2' of FIG. 6, since a height of the second conductive plug CP1 is greater than a height (e.g., measured along the Z direction) of each of the first conductive plugs CP1, on the fin-type active region FA, a second conductive via contact VC2 and at least one of the first conductive plugs CP1 adjacent to the second conductive via contact VC2 may be separated from each other in the Z direction. In addition, the second conductive via contact VC2 and at least one of the first conductive plugs CP1 adjacent to the second conductive via contact VC2 may be separated from each other in the X direction, as shown in FIG. 6. The second conductive via contact VC2 may be connected to the second conductive plug CP2. A vertical space between a bottom surface of the second conductive via contact VC2 and a top surface of the first conductive plug CP1 may be filled with the sidewall capping layer 382D. The sidewall capping layer 382D may have an increased etch resistance. Accordingly, even if a misalignment occurs when forming the contact hole (refer to a second contact hole CH2 of FIG. 8O) for forming the second via contact VC2, an short circuit between the first conductive plug CP1 and the second conductive via contact VC2 may be prevented by the sidewall capping layer 382D.

Figure 7:
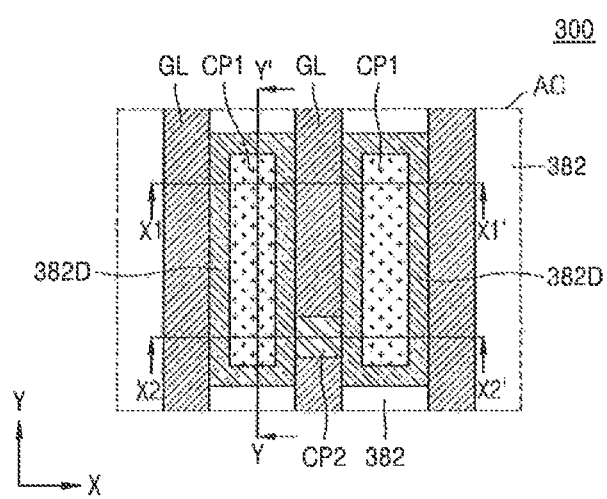
FIG. 7 is a plan view illustrating a configuration of the integrated circuit device shown in FIG. 6 according to an exemplary embodiment of the inventive concept.

FIG. 7 is a plan view illustrating a configuration of the integrated circuit device 300 shown in FIG. 6 according to an exemplary embodiment of the inventive concept.

Referring to FIG. 7, the plurality of gate lines GL, a plurality of sidewall capping layers 382D, the plurality of first conducive plugs CP1 and the second conductive plug CP2 may be disposed on the device active region AC.

The sidewall capping layers 382D may each have a ring shape surrounding a respective first conductive plug CP1, disposed between two adjacent gate lines GL in plan view. The sidewall capping layers 382D may each be formed between the two adjacent gate lines GL to contact sidewalls of the respective first conductive plug CP1 and to surround of the respective first conductive plugs CP1.

Figure 8A:
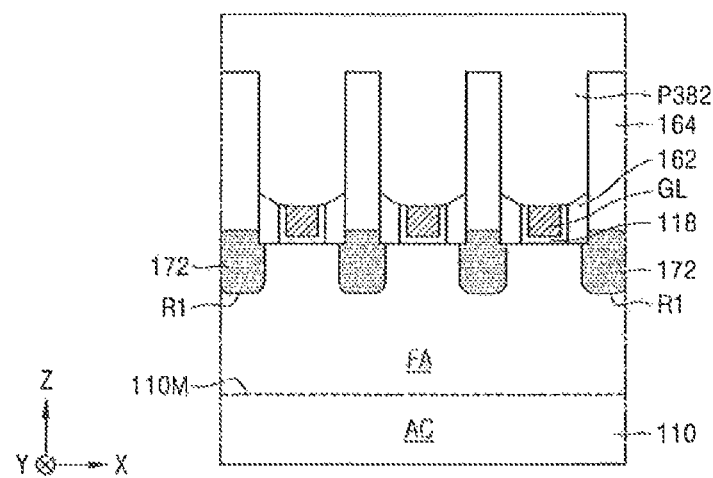
FIGS. 8A through 8R are cross-sectional views illustrating stages of a method of manufacturing an integrated circuit device, according to an exemplary embodiment of the inventive concept.
Figure 8B:
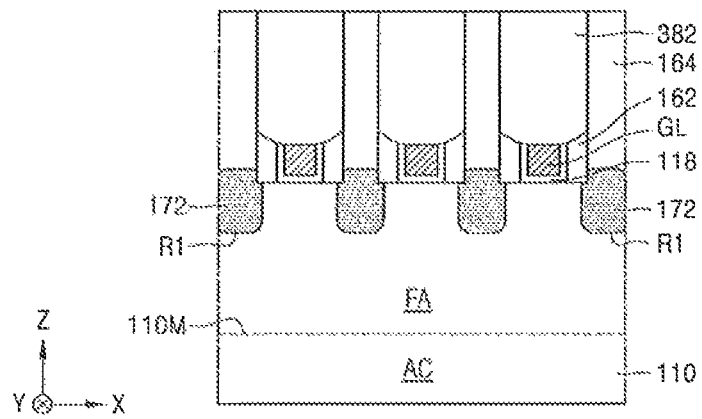
Figure 8C:
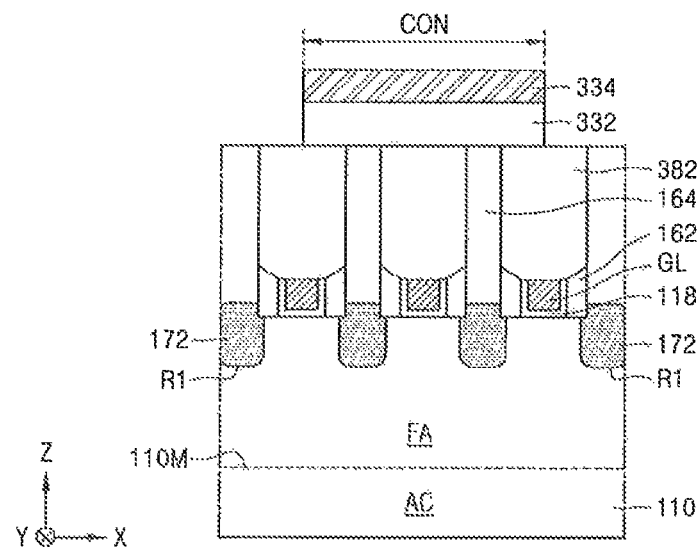
Figure 8D:
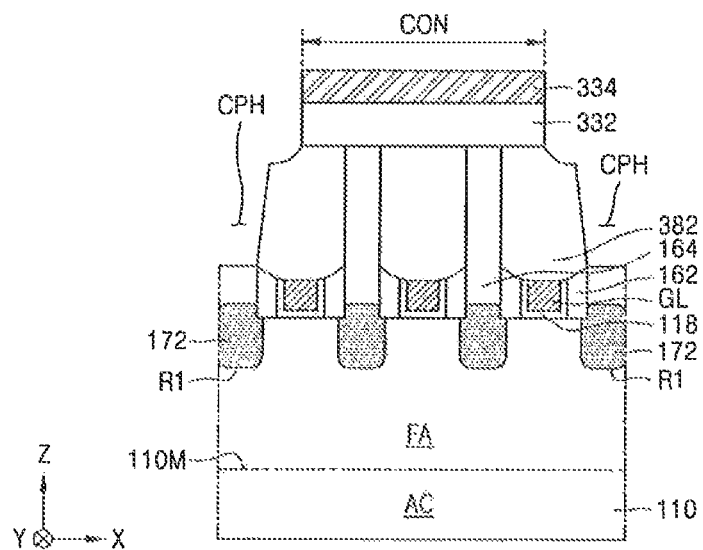
Figure 8E:
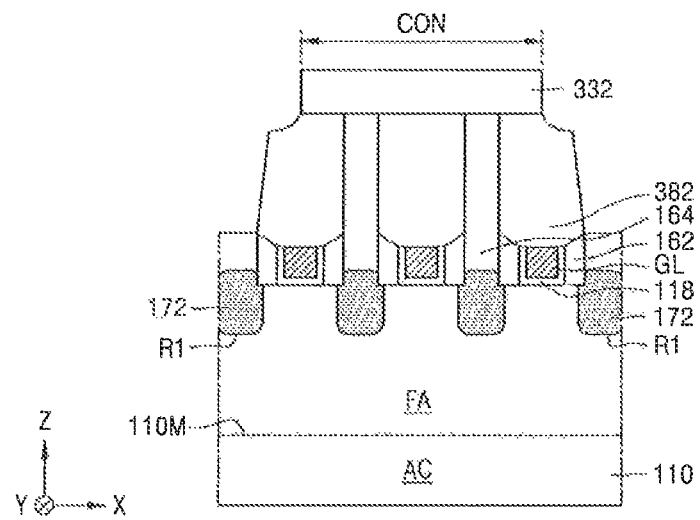
Figure 8F:
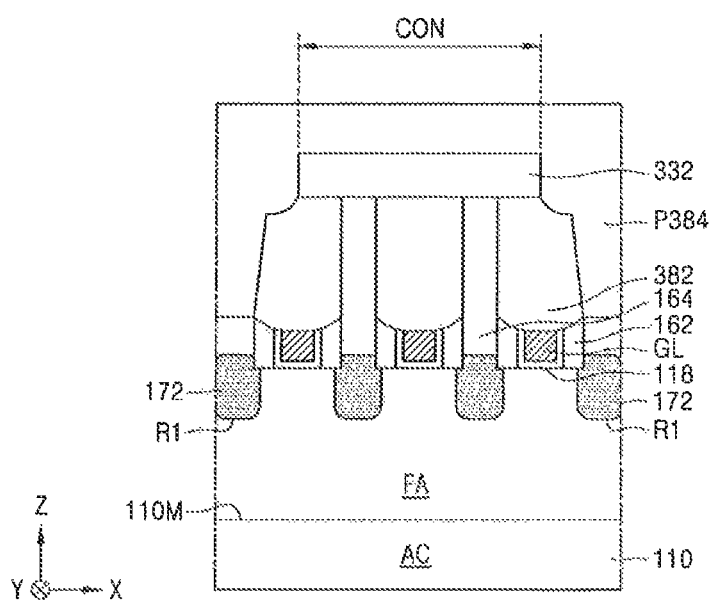
Figure 8G:
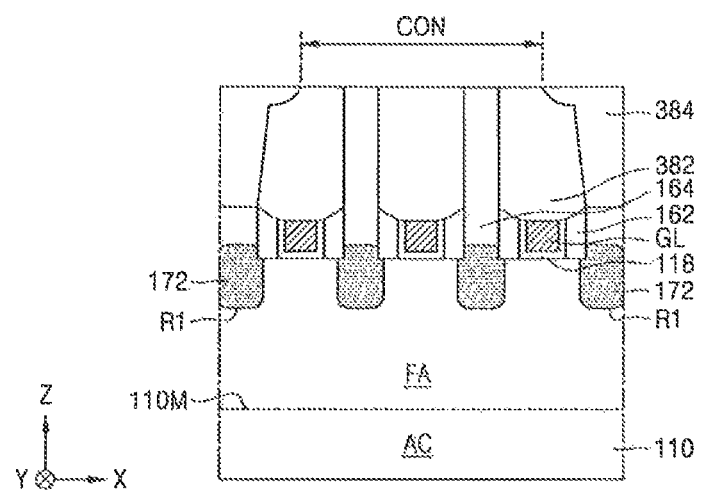
Figure 8H:
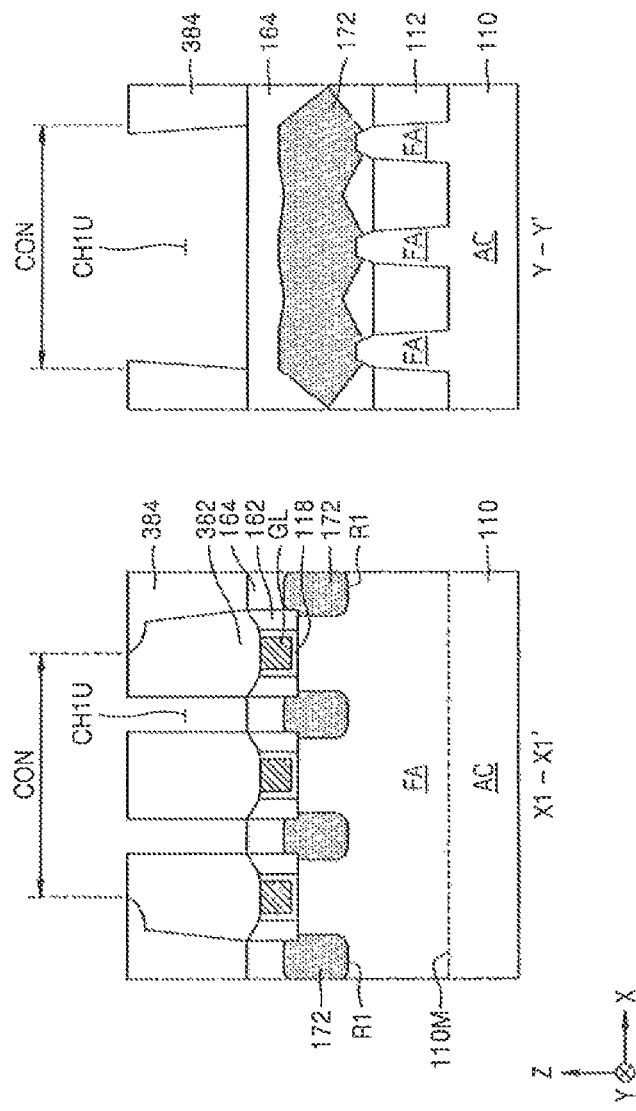
Figure 8I:
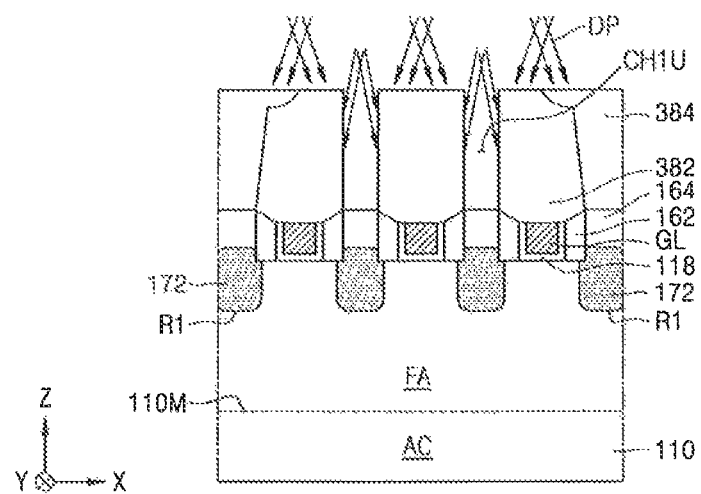
Figure 8J:
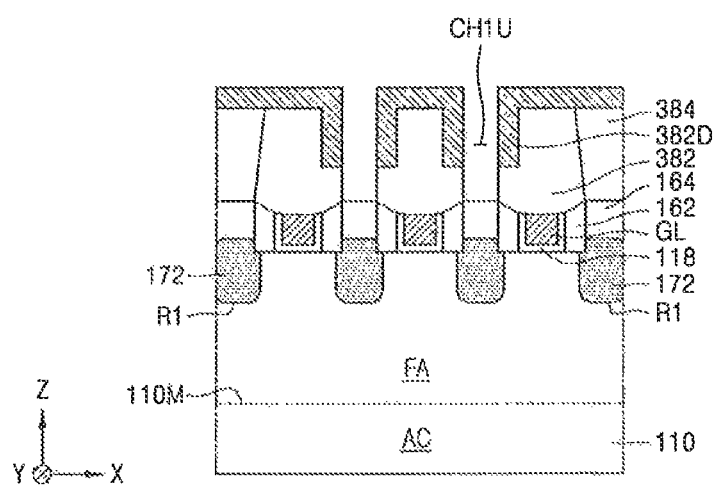
Figure 8K:
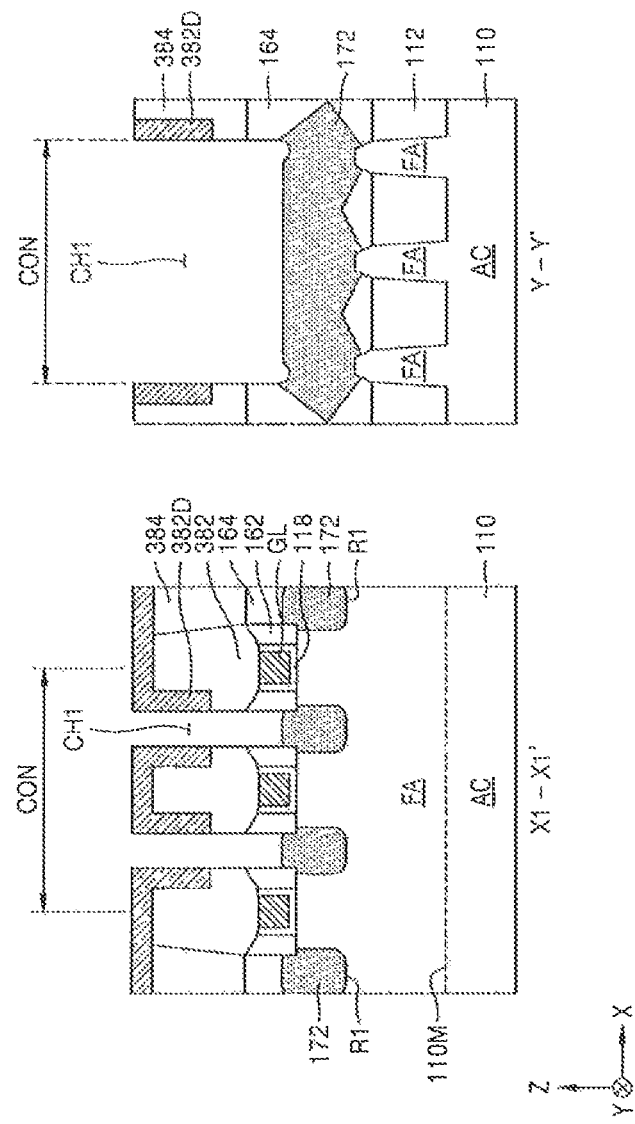
Figure 8L:
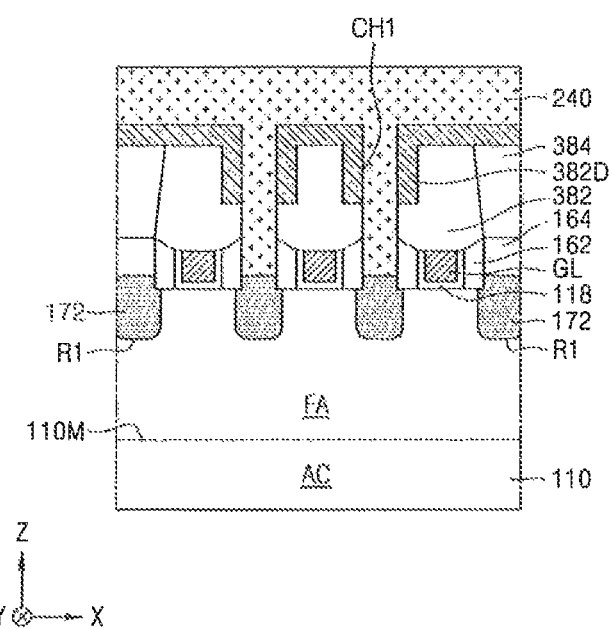
Figure 8M:
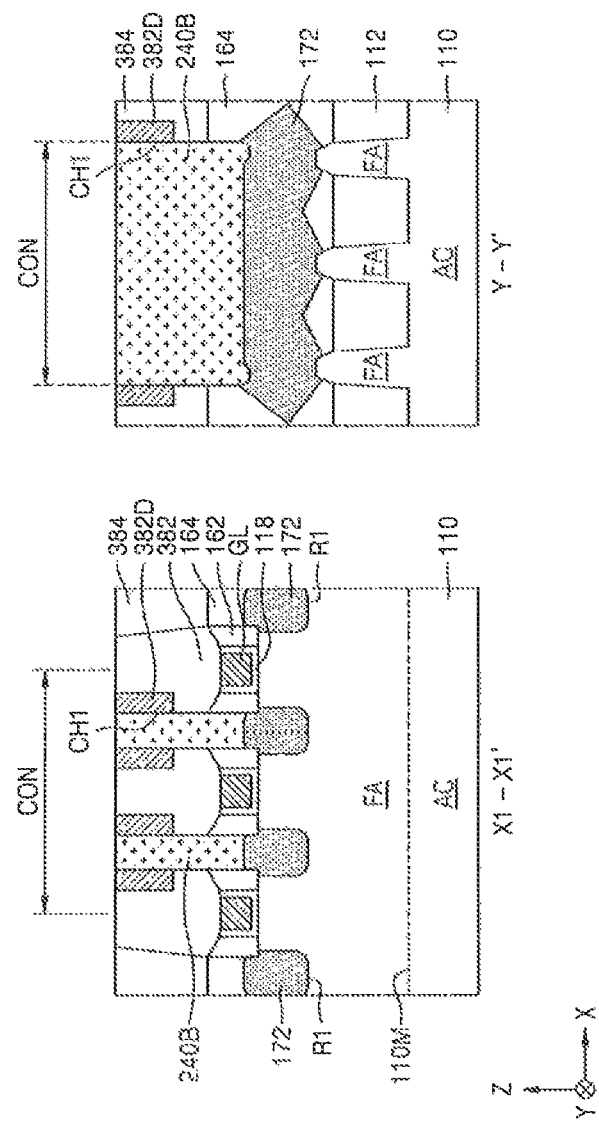
Figure 8N:
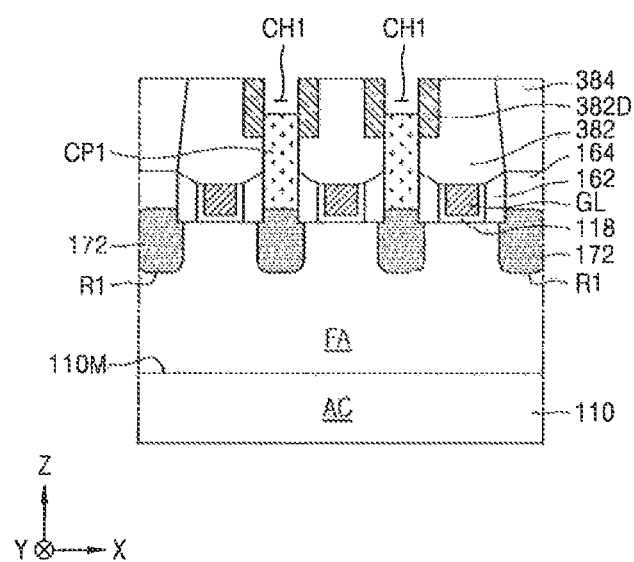
Figure 80:
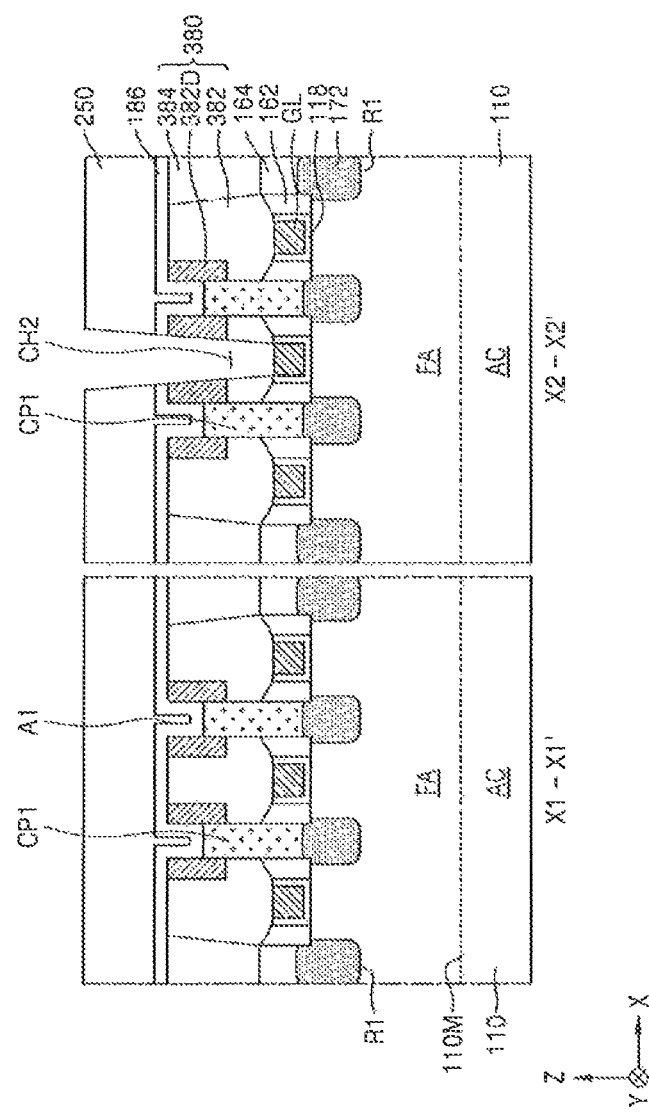
Figure 8P:
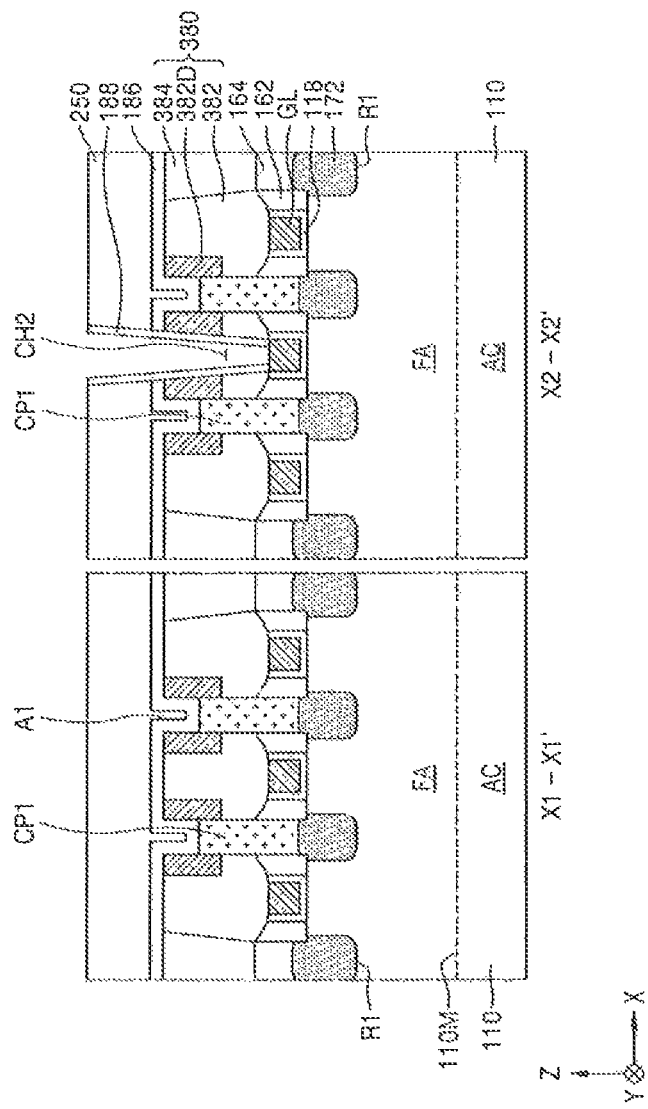
Figure 8Q:
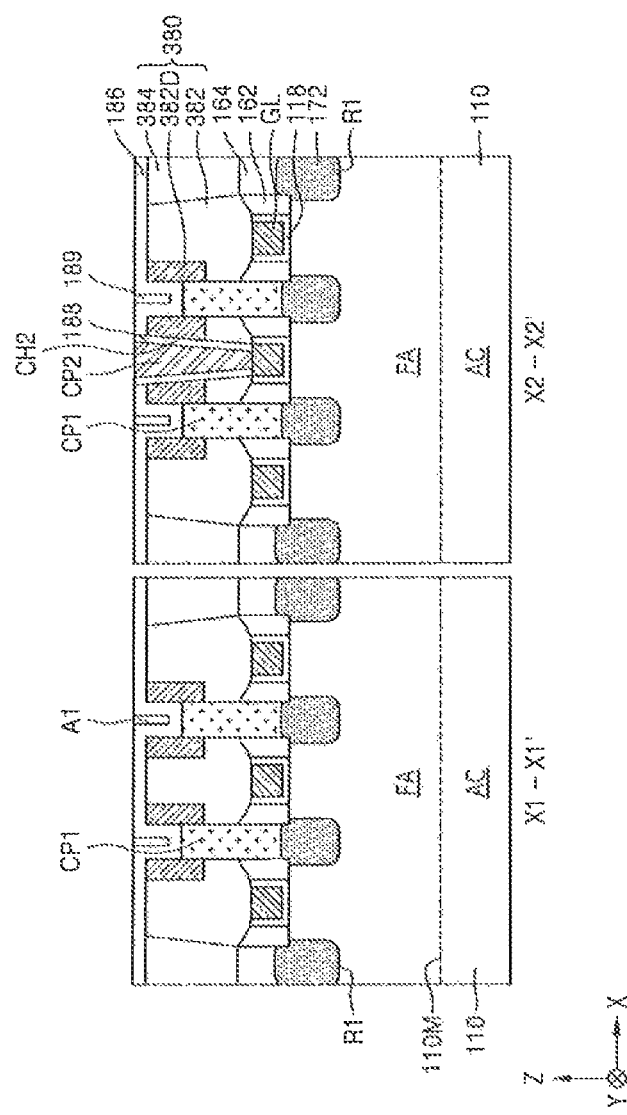
Figure 8R:
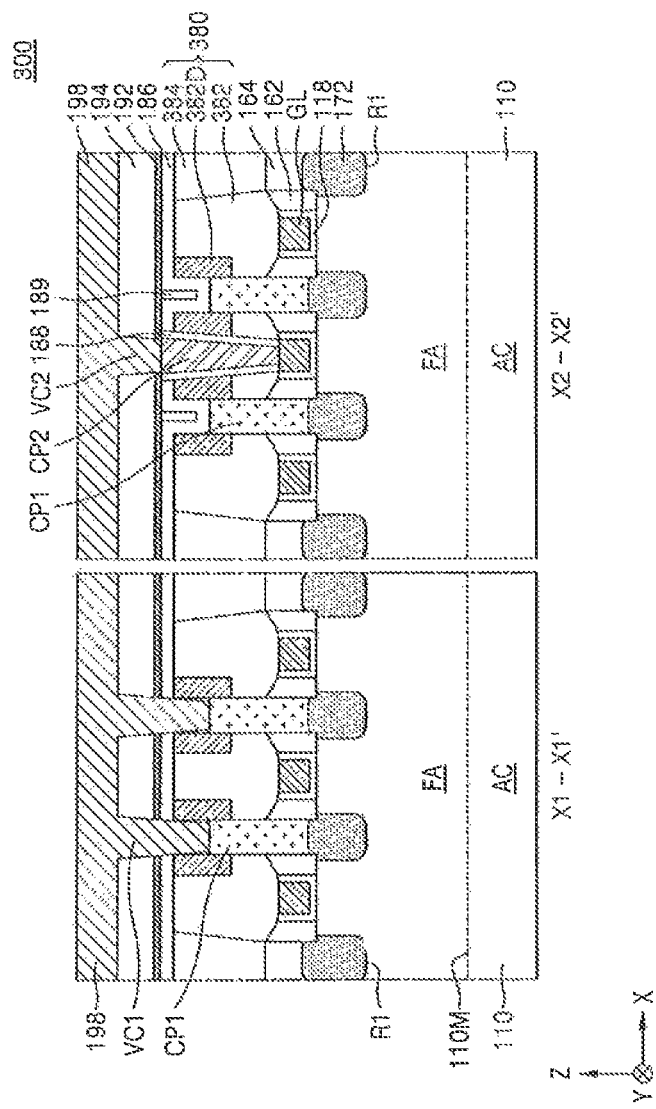

FIGS. 8A through 8R are cross-sectional views illustrating stages of a method of manufacturing an integrated circuit device, according to an exemplary embodiment of the inventive concept. With reference to FIGS. 8A through 8R, a method of manufacturing the integrated circuit device 300 shown in FIGS. 6 and 7 is described. In FIGS. 8A through 8R, FIGS. 8H, 8K and 8M are cross-sectional views taken along lines X1-X1' and Y-Y' of FIG. 7, and FIGS. 8O through 8R are cross-sectional views taken along lines X1-X1' and X2-X2' of FIG. 7.

Referring to FIG. 8A, the same process as described with reference to FIGS. 4A through 4F may be performed. Thus, a plurality of capping spaces CS (refer to 4F) may be respectively formed on gate lines GL that are formed on a substrate 110, and then a preliminary gate capping layer P382 may be formed to fill the capping spaces CS.

The preliminary gate capping layer P382 may be formed with a thickness large enough to fill each of the capping spaces CS and cover a top surface of an inter-gate insulating layer 164. The preliminary gate capping layer P382 may include a silicon nitride layer.

Referring to FIG. 8B, the preliminary gate capping layer P382 may be partially removed to expose a top surface of the inter-gate insulating layer 164, and thus a core capping layer 382 may be formed to loll each of the capping spaces CS.

Referring to FIG. 8C, a first hard mask pattern 332 and a second hard mask pattern 334 may be formed on a selected region of a device active region AC of the substrate 110 to cover the core capping layer 382 and the inter-gate insulating layer 164. A region on the device active region AC, covered by the first and second hard mask patterns 332 and 334 may become a contact region CON including a region in which a plurality of conductive plugs CP1 (refer to FIG. 6) are formed in the following process, according to an exemplary embodiment of the inventive concept.

In an exemplary embodiment of the inventive concept, the first hard mask pattern 332 may include an oxide layer, for example, a TEOS layer, and the second hard mask pattern 334 may include a metal nitride layer, for example, a titanium nitride (TiN) layer.

Referring to FIG. 8D, the inter-gate insulating layer 164, exposed around the first and second hard mask patterns 332 and 334, may be etched to a predetermined depth using the first and second hard mask patterns 332 and 334 as an etch mask and using an etch selectivity difference between the inter-gate insulating layer 164 and the core capping layer 382 such that a plurality of capping holes CPH may be self-aligned with the core capping layer 382. The inter-gate insulating layer 164 may be exposed on bottom surfaces of the capping holes CPH. The inter-gate insulating layer 164 may cover the gate lines GL such that the gate lines GL may not be exposed through the capping holes CPH.

An upper portion of the core capping layer 382 may be partially consumed or etched when etching a portion of the inter-gate insulating layer 164 exposed around the first and second hard mask patterns 332 and 334.

Referring to FIG. 8E, the second hard mask pattern 334 may be removed to expose a top surface of the first hard mask pattern 332.

Referring to FIG. 8F, a preliminary inter-gate capping layer P384 may be formed to fill each of the capping holes CPH and cover the first hard mask pattern 332. The preliminary inter-gate capping layer P384 may include a silicon nitride layer.

Referring to FIG. 8G, the preliminary inter-gate capping layer P384 may be planarized and the first hard mask pattern 332 may be removed. Thus, the top surface of the inter-gate insulating layer 164 may be exposed in the contact region CON. As a result, a portion of the preliminary inter-gate capping layer P384 may remain on the device active region in addition to the contact region CON such that an inter-gate capping layer 384, covering the inter-gate insulating layer 164 between the gate lines GL, may be formed.

Referring to FIG. 8H, the inter-gate insulating layer 164, exposed in the contact region CON, may be etched to a predetermined depth using an etch selectivity difference between the core capping layer 382 and the inter-gate capping layer 384. Thus, a plurality of first upper contact holes CH1U may be formed to be self-aligned with the core capping layer 382. A remaining portion of the inter-gate insulating layer 164 may be exposed on a bottom surface of each of the first upper contact holes CH1U. The remaining portion of the inter-gate insulating layer 164 may act as a protection layer to prevent each of the first upper contact holes CH1U from exposing a source/drain region 172. The etching of the inter-gate insulating layer 164 for forming the first upper contact holes CH1U may be performed by a wet etching process. While etching the inter-gate insulating layer 164 exposed in the contact region CON, a sidewall profile of the core capping layer 382, exposed by the first upper contact holes CH1U, may be maintained to have a substantially vertical profile because a width of each of the first upper contact holes CH1U is narrow in ±X direction. The X direction is a minor axis direction of the first upper contact hole CH1U. A width of each of the first upper contact holes CH1U is large in ±Y direction. The Y direction is a major axis direction of the first upper contact hole CH1U. Due to the large width of each of the first upper contact holes CH1U in ±Y direction, a portion of the inter-gate capping layer 384, exposed by the first upper contact holes CH1U, may be consumed or etched under an etching atmosphere. A consumption or etch amount of a portion of the inter-gate capping layer 384 exposed on the bottom surface of each of the first upper contact holes CH1U may be greater than a consumption or etch amount of a portion of the inter-gate capping layer 384 exposed on an upper portion of each of the first upper contact holes CH1U. As shown in the cross-sectional view taken along line Y-Y' of FIG. 8H, the first upper contact hole CH1U may have a sloped profile toward to a middle portion of the first upper contact hole CH1U.

Referring to FIG. 8I, an oblique ion implantation process similar to that described with reference to FIG. 4H may be performed to selectively implant dopants DP into upper portions of the core capping layer 382 and the inter-gate capping layer 384. As a result, as shown in FIG. 8J, the dopants DP may be implanted into a top surface of the core capping layer 382, sidewalls of the core capping layer 382 exposed by the first upper contact holes CH1U and a top surface of the inter-gate capping layer 384. Thus, a sidewall capping layer 382D may be formed and a lower portion of the core capping layer 382 may not be implanted with the dopants DP. The sidewall capping layer 382D may also include upper parts of the sidewalls of the inter-gate capping layer 384, as shown in FIG. 8K. While performing the oblique ion implantation process, the inter-gate insulating layer 164 may act as a protection layer to prevent the dopants from being implanted into the source/drain region 172.

Referring to FIG. 8K, the inter-gate insulating layer 164, exposed through each of the first upper contact holes CH1U, may be removed from the resulting structure of FIG. 8J to form a first contact hole CH1. The first contact hole CH1 may expose the source/drain region 172.

The etching of the inter-gate insulating layer 164 for forming the first contact hole CH1 may be performed using a dry etching process. In the case in which the inter-gate capping layer 384 has a sloped sidewall, as described with reference to FIG. 8H, the sloped sidewall of the inter-gate capping layer 384 may be chamfered such that the sidewall of the inter-gate capping layer 384, defining the first upper contact hole CH1U in the ±Y direction, may have a substantially vertical profile, as shown in FIG. 8K. Since the first contact hole CH1 is formed using a multi-stage etching process including the wet etching process described with reference to FIG. 8H and the dry etching process described with reference to FIG. 8K, an exposed area of the source/drain region 172 on a bottom surface of the first contact hole CH1 may be increased. Thus, a contact resistance between the source/drain region 172 and the first conductive plug CP1, to be formed in the first contact hole CP1 in the following process, may be reduced.

Referring to FIG. 8L, a first conductive layer 240 may be formed with a thickness large enough to fill each of the first contact holes CH1 by using a process similar to that described with reference to FIG. 4N.

Referring to FIG. 8M, the first conductive layer 240 may be planarized and a portion of the sidewall capping layer 382D on the top surface of the core capping layer 382 and the top surface of the inter-gate capping layer 384 may be removed such that a plurality of preliminary first conductive plugs 240B may be formed to fill the first contact holes CH1. As a result, the sidewall capping layer 382D may remain on a sidewall of the upper portion of each of the first contact holes CH1. Top surfaces of the preliminary first conductive plugs 240B may be substantially coplanar with a top surface of the complex capping layer 380.

Referring to FIG. 8N, the preliminary first conductive plugs 240B may be selectively etched-back to a predetermined depth using an etch selectivity of the preliminary first conductive plugs 240B with respect to the complex capping layer 380 by using a process similar to that described with reference to FIG. 4P such that a plurality of first conductive plugs CP1 may be formed to have a reduced height. Upper portions of the first contact holes CH1 may remain as empty spaces on the first conductive plugs CP1.

Referring to FIG. 8O, an insulating liner 186 is formed to conformally cover the resulting structure of FIG. 8N. Then, by a process similar to that described with reference to FIGS. 4Q and 4R, a third hard mask pattern 250 may be formed on the insulating liner 186 to expose a portion of the insulating liner 186. Then, the exposed portion of the insulating liner 186 and the complex capping layer 380 may be etched to form a second contact hole CH2 exposing at least one of the gate lines GL. The sidewall capping layer 382D may have a high etching resistance compared to the core capping layer 382 and the inter-gate capping layer 384 under the same etching condition. Thus, consumption or etch of the sidewall capping layer 382D may be suppressed such that the second contact hole CH2 may be formed at a desired position without being misaligned. The second contact hole CH2 may be formed to be isolated from adjacent first conductive plugs CP1.

Referring to FIG. 8P, a plug insulating spacer 188 may be formed to cover the complex capping layer 380, exposed in the second contact holes CH2, by a process similar to that described with reference to FIGS. 4S and 4T.

Referring to FIG. 8Q, by using a process similar to that described with reference to FIGS. 4U and 4V, a second conductive layer 260 may be formed with a thickness large enough to fill the second contact hole CH2. Then, the resulting structure, having the second conductive layer 260, may be planarized to expose a top surface of the insulating liner 186 such that a pocket insulating layer 189 that is a portion of the third hard mask pattern 250 may remain in the pocket regions A1 (refer to FIG. 4Q) and the second conductive plug CP2 may remain in the second contact hole CH2.

Referring to FIG. 8R, by using a similar process as that described with reference to FIG. 4W, a stopper insulating layer 192 and an upper insulating layer 194 may be sequentially formed on the resulting structure of FIG. 8Q. A top surface of the second conductive plug CP2 is exposed on the resulting structure of FIG. 8Q. A plurality of first conductive via contacts VC1 may be formed to penetrate the upper insulating layer 194 and the stopper insulating layer 192, the pocket insulating layer 189 and the insulating liner 186 and to be connected to the first conductive plugs CP1. A second via contact VC2 may be formed to penetrate the upper insulating layer 194 and the stopper insulating layer 192 and to be connected to the second conductive plug CP2. A plurality of interconnection layers 198 may be formed to be connected to the first and second conductive via contacts VC1 and VC2.

Figure 9:
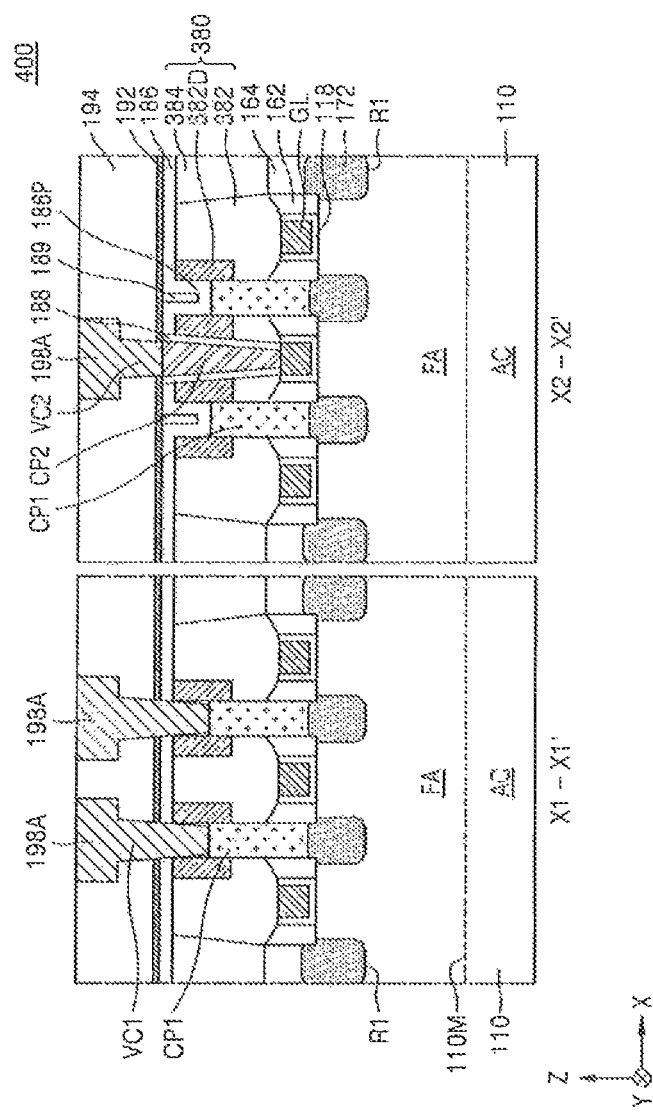
FIG. 9 is a cross-sectional view illustrating an integrated circuit device according to an exemplary embodiment of the inventive concept.

FIG. 9 is a cross-sectional view illustrating an integrated circuit device according to an exemplary embodiment of the inventive concept. An integrated circuit device 400 shown in FIG. 9 may be substantially the same as the integrated circuit device 300 shown in FIGS. 6 and 7. However, a plurality of conductive via contacts VC1 may be connected to different interconnection layers 198A. Some of the interconnection layers 198A may extend in a direction crossing the fin-type active regions FA.

Figure 10:
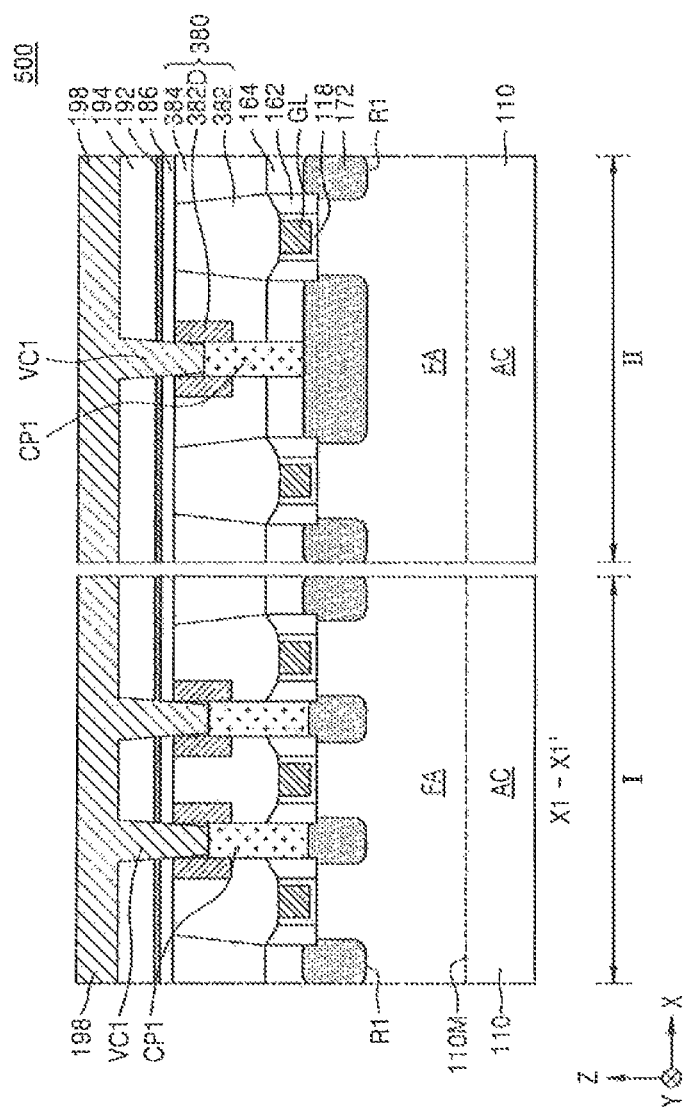
FIG. 10 is a cross-sectional view illustrating an integrated circuit device according to an exemplary embodiment of the inventive concept.

FIG. 10 is a cross-sectional view illustrating an integrated circuit device according to an exemplary embodiment of the inventive concept.

Referring to FIG. ID, an integrated circuit device 500 may include a first device region I and a second device region II. The first device region I may include a portion corresponding to a cross-section taken along line X1-X1' of FIG. 7.

In an exemplary embodiment of the inventive concept, the first device region I and the second device region II may be regions that perform different functions. In an exemplary embodiment of the inventive concept, the first device region I may be a region in which a device operating in a low power mode is formed, and the second device region II may be a region in which a device operating in a high power mode is formed. In an exemplary embodiment of the inventive concept, the first device region I may be a region in which a memory device or a logic circuit is formed, and the second device region II may be a region in which a peripheral circuit such as an input/output device is formed.

The first device region I may have the same configurations as the integrated circuit device 300 described with reference to FIGS. 6 and 7.

A pitch of a plurality of gate lines GL formed in the second region II may be greater than a pitch of a plurality of gate lines GL formed in the second region I. The pitch may be, for example, a center to center distance between adjacent gate lines GL. In the second device region II, a first conductive plug CP1, connected to a source/drain region 172, may be formed between two adjacent gate lines GL. The first conductive plug CP1 in the second device region II may have substantially the same configurations as the first conductive plug CP1 in the first device region I. However, in the second device region II, a sidewall capping layer 382D of a complex capping layer 380 may be formed to vertically overlap the source/drain region 172, and the first conductive plug CP1 may contact the sidewall capping layer 382D. In the second device region II, the first conductive plug CP1 may be formed to be spaced apart from an insulating spacer 162, covering sidewalls of each of the gate lines GL. In the second device region II, an inter-gate insulating layer 164 may be interposed between the first conductive plug CP1 and the insulating spacer 162.

Figure 11A:
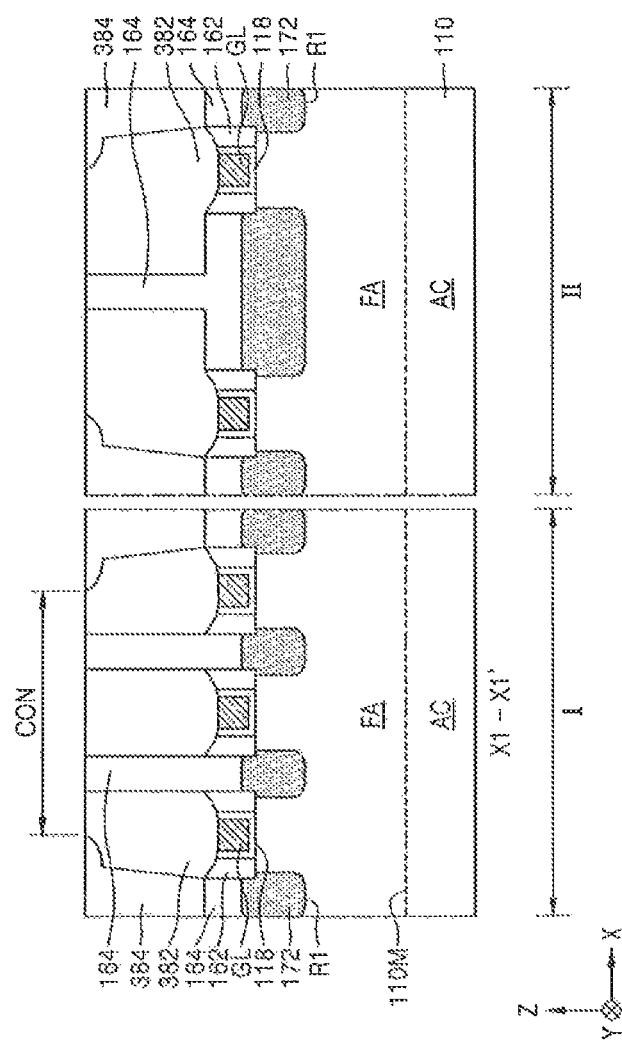
FIGS. 11A and 11B are cross-sectional views illustrating stages of a method of manufacturing an integrated circuit device according to an exemplary embodiment of the inventive concept.
Figure 11B:
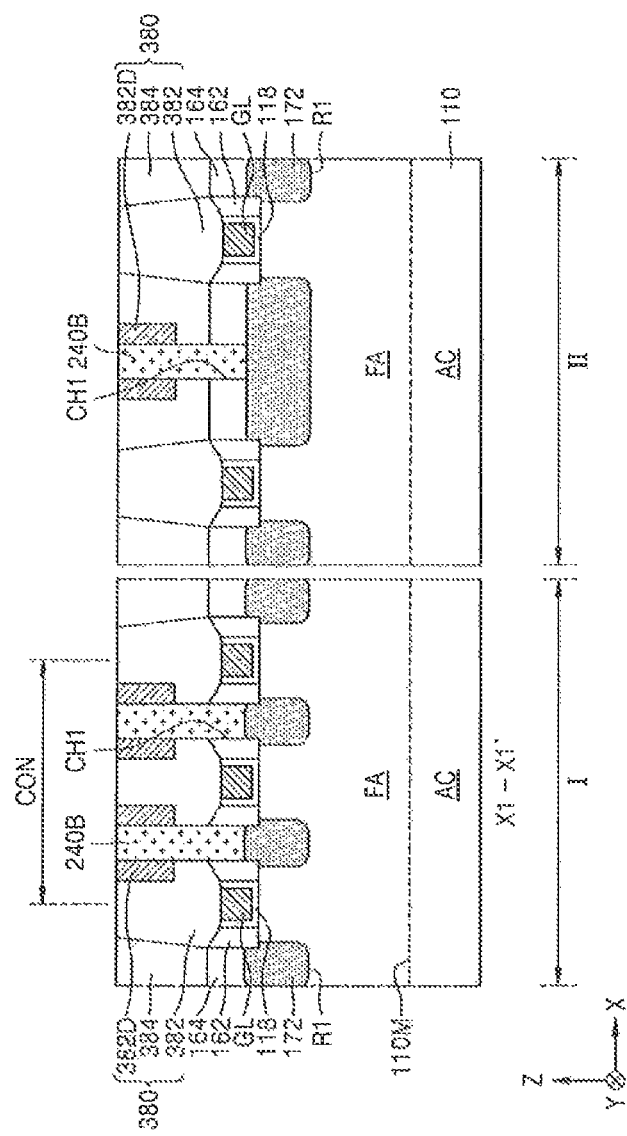

FIGS. 11A and 11B are cross-sectional views illustrating stages of a method of manufacturing an integrated circuit device according to an exemplary embodiment of the inventive concept. A method of the integrated circuit device 500 shown in FIG. 10 is described with reference to FIGS. 11A and 11B.

Referring to FIG. 11A, after preparing a substrate 110 including a first device region I and a second device region II, an inter-gate capping layer 384 may be formed in the first and second device regions I and II to cover an inter-gate insulating layer 164 between each of a plurality of gate lines GL by using a process similar to that described with reference to FIGS. 8A through 8G. However, in a region for forming a first conductive plug CP1 in the second device region II, the inter-gate insulating layer 164 may remain without forming the inter-gate capping layer 384, similar to a contact region CON of the first device region I.

Referring to FIG. 11B, a similar process as that described with reference to FIGS. 8H through 8M may be performed on the resulting structure of FIG. 11A to form a plurality of preliminary first conductive plugs 240B in the first device region I and the second device region II. In this case, when dry-etching the inter-gate insulating layer 164 to form a plurality of first contact holes CH1 in which the preliminary first conductive plugs 240B are formed in the first and second device regions I and II, the first contact holes CH1 exposing the source/drain regions 172, a sidewall capping layer 382D of the complex capping layer 380 may have a high etch resistance compared to the core capping layer 382 and the inter-gate capping layer 384 under the same etching atmosphere. Accordingly, during the formation of the first contact holes CH1, the sidewall capping layer 382D exposed through the first contact holes CH1 may be suppressed from being consumed or etched under the etching atmosphere. Thus, the first contact holes CH1 may be formed to be isolated from neighboring gate lines GL.

Then, the similar processes as those described with reference to FIGS. 8N through 8R may be performed such that the integrated circuit device 500 shown in FIG. 10 may be manufactured.

Figure 12:
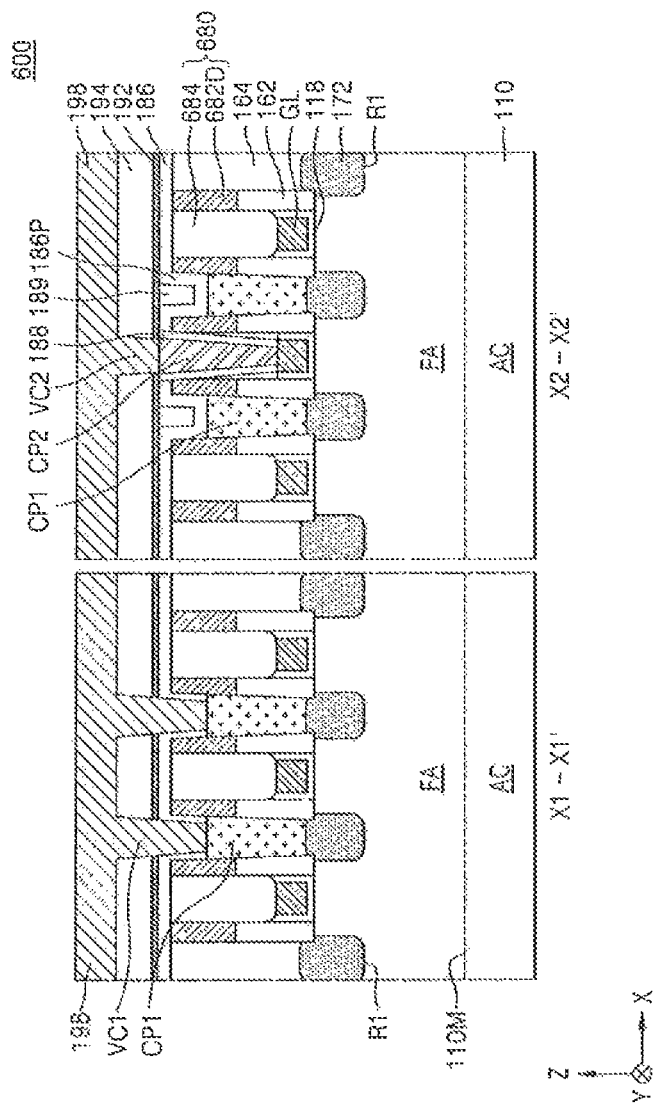
FIG. 12 is a cross-sectional view illustrating an integrated circuit device according to an exemplary embodiment of the inventive concept.

FIG. 12 is a cross-sectional view illustrating an integrated circuit device according to an exemplary embodiment of the inventive concept. FIG. 12 illustrates a cross-sectional view taken along lines X1-X1' and X2-X2' of FIG. 1.

Referring to FIG. 12, an integrated circuit device 600 may have the same configuration as the integrated circuit device 100 described with reference to FIGS. 1 through 3. However, the integrated circuit device 600 may include a plurality of complex capping layers 680 including two layers having different compositions.

The complex capping layers 680 may respectively vertically overlap gate lines GL and an insulating spacer 162 and may extend parallel to the gate lines GL. The complex capping layers 680 may each include a core capping layer 684 contacting a top surface of each of the gate lines GL and having a greater width than a width of each of the gate lines GL in a length direction (e.g., an X direction) of a fin-type active region FA, and a sidewall capping layer 682D covering sidewalls of the core capping layer 684. The sidewall capping layer 682D may be disposed to vertically overlap the insulating spacer 162 and may be integrally formed with the insulating spacer 162. A vertical height of the sidewall capping layer 682D may be smaller than a vertical height of the core capping layer 684. The insulating spacer 162 may extend above each of the gate lines GL to cover sidewalls of each of the gate lines GL and the core capping layer 684.

The core capping layer 684 may have substantially the same configuration as the core capping layer 184 described with reference to FIG. 1. The sidewall capping layer 682D may include a doped silicon oxycarbonitride (SiOCN) layer, and/or a doped silicon carbonitride (SiCN). For example, the sidewall capping layer 682D may include dopants such as B, Si, C, N, As, P, O, F, Ar, Ge, H or He. In the case in which the insulating spacer 162 includes a silicon oxycarbonitride (SiOCN) layer and the sidewall capping layer 682D includes a silicon oxycarbonitride (SiOCN) layer doped with silicon (Si), a silicon (Si) composition of the sidewall capping layer 682D may be greater than a silicon (Si) composition of the insulating spacer 162. In the case in which the insulating spacer 162 includes a silicon carbonitride (SiCN) layer and the sidewall capping layer 682D includes a silicon carbonitride (SiCN) layer doped with silicon (Si), a silicon (Si) composition of the sidewall capping layer 682D may be greater than a silicon (Si) composition of the insulating spacer 162.

Figure 13A:
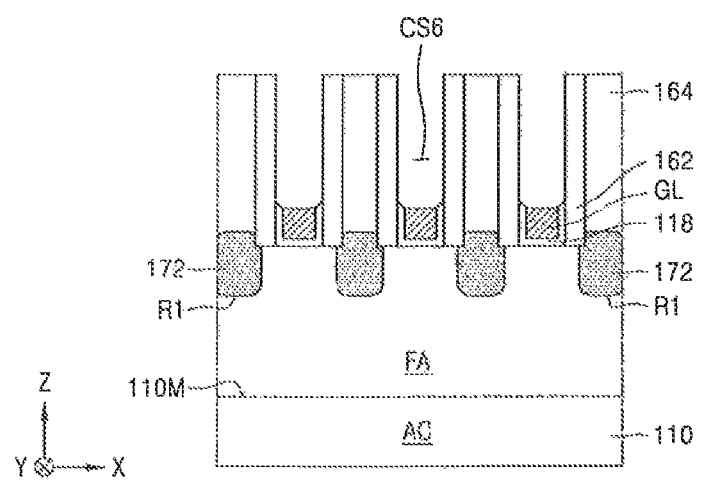
FIGS. 13A and 13B are cross-sectional views illustrating stages of a method of manufacturing an integrated circuit device according to an exemplary embodiment of the inventive concept.
Figure 13B:
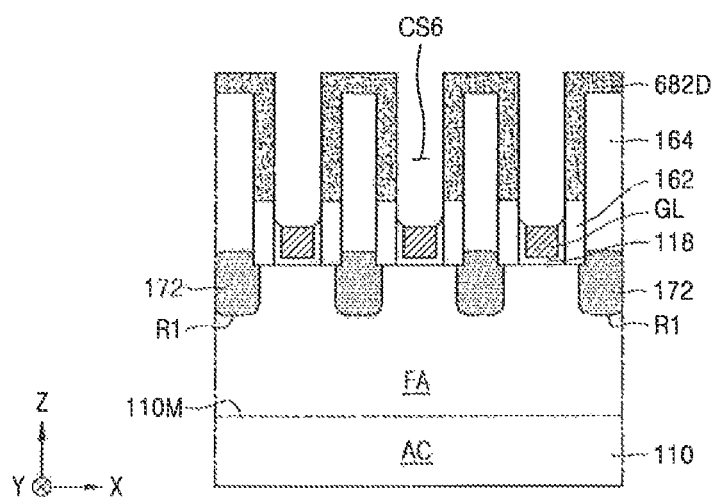

FIGS. 13A and 13B are cross-sectional views illustrating stages of a method of manufacturing an integrated circuit device according to an exemplary embodiment of the inventive concept. A method of manufacturing an integrated circuit device 600 shown in FIG. 12 is described with reference to FIGS. 13A and 13B.

Referring to FIG. 13A, a plurality of gate lines GL may be formed on a substrate 110 by performing the same processes as those described with reference to FIGS. 4A through 4E. Then, a plurality of capping spaces CS6 may be formed on the gate lines GL by a process similar to that described with reference to FIG. 4F. However, the gate lines GL and gate insulating layers 118 may be etched to form the capping spaces CS6 without etching an insulating spacer 162. Thus, the insulating spacer 162 may be exposed on sidewalls of the capping spaces CS6.

Referring to FIG. 13B, a similar oblique ion implantation process as that described with reference to FIG. 4H may be performed on the resulting process of FIG. 13A. Thus, dopants DP may be selectively implanted into an upper portion of the insulating spacer 162 exposed in the capping spaces CS6 and an upper portion of the inter-gate insulating layer 164, to form a sidewall capping layer 682D.

Then, the processes described with reference to FIGS. 4J through 4W may be performed to manufacture the integrated circuit device 600 shown in FIG. 12.

Figure 14A:
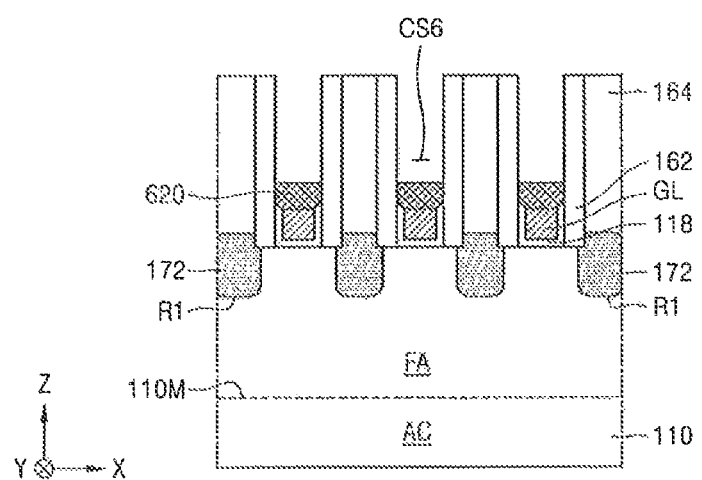
FIGS. 14A and 14B are cross-sectional views illustrating stages of a method of manufacturing an integrated circuit device according to an exemplary embodiment of the inventive concept.
Figure 14B:
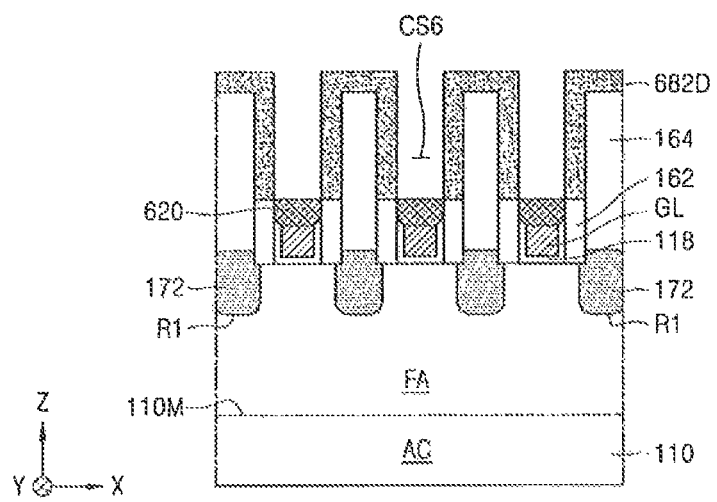

FIGS. 14A and 14B are cross-sectional views illustrating stages of a method of manufacturing an integrated circuit device according to an exemplary embodiment of the inventive concept. A method of manufacturing an integrated circuit device 600 shown in FIG. 12 is described with reference to FIGS. 14A and 14B. In FIGS. 14A and 14B.

Referring to FIG. 14A, a plurality of capping spaces CS6 may be formed on a plurality of gate lines GL by using a process similar to that described with reference to FIG. 13A. Then, a protection layer 620 may be formed to cover the gate lines GL and the gate insulating layers 118, and to fill lower portions of the capping spaces CS6 such that the gate lines GL and the gate insulating layers 118 may not be exposed.

In an exemplary embodiment of the inventive concept, the protection layer 620 may be formed by using a spin coating method. For example, the protection layer 620 may include a spin on hardmask (SOH) layer. The SOH layer may include a hydrocarbon compound having a relatively high carbon content of about 85% to 99% by weight based on the total weight of the SOH layer, or a derivative thereof.

Referring to FIG. 14B, an oblique ion implantation process similar to that described with reference to FIG. 4H may be performed on the structure in which the protection layer 620 covers the gate lines and the gate insulating layer 118. Thus, dopants DP may be selectively implanted into an upper portion of the insulating spacer 162 exposed in the capping spaces CS6 and an upper portion of the inter-gate insulating layer 164, to form a sidewall capping layer 682D.

Then, the processes described with reference to FIGS. 4J through 4W may be performed to manufacture the integrated circuit device 600 shown in FIG. 12.

Figure 15:
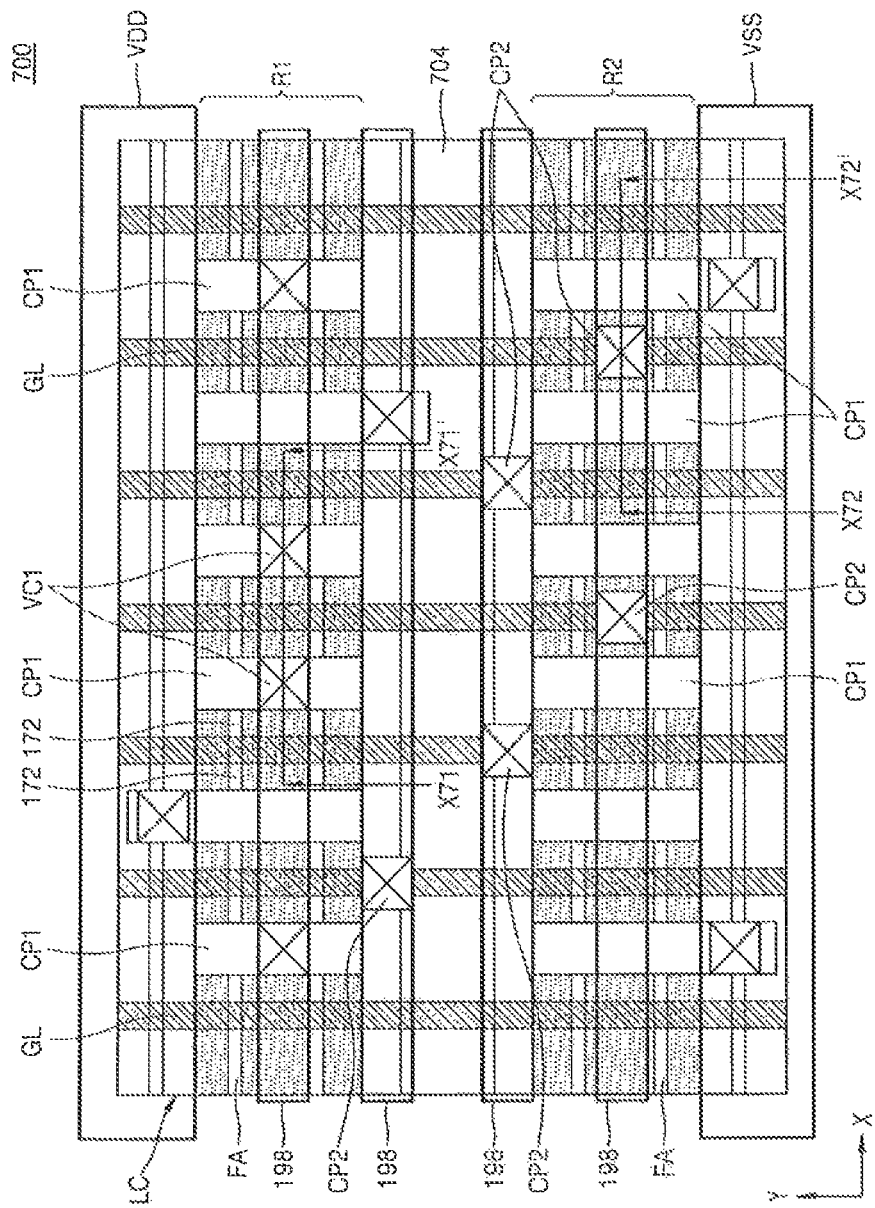
FIG. 15 is a plan view illustrating a configuration of an integrated circuit device according to an exemplary embodiment of the inventive concept.

FIG. 15 is a plan view illustrating a configuration of an integrated circuit device according to an exemplary embodiment of the inventive concept.

Referring to FIG. 15, an integrated circuit device 700 may include a logic cell region LC on a substrate 110 (e.g., the substrate 110 of FIG. 2A). The logic cell region LC may include a first device region R1 and a second device region R2. A device isolation insulating layer 704 may be disposed in the substrate 110 between the first device region R1 and the second device region R2. A plurality of fin-type active regions FA may extend in parallel in a direction (e.g., in an X direction) in the first and second device regions R1 and R2.

An isolation insulating layer 112 may be formed between each of the fin-type active regions FA, like those shown in FIG. 2B.

A plurality of first conductive plugs CP1 may be formed on the fin-type active regions FA to be connected to source/drain regions 172 on the fin-type active regions FA. A plurality of second conductive plugs CP2 may be formed on the fin-type active regions FA to be connected to gate lines GL on the fin type active regions FA. The first conductive plugs CP1 and the second conductive plugs CP2 may be isolated by an insulating interlayer covering the fin-type active regions FA and the gate lines GL.

A plurality of first via contacts VC1 may be formed on the first conductive plugs CP1 to be connected to the first conductive plugs CP1. A plurality of second via contacts may be formed on the second conductive plugs CP2 to be connected to the second conductive plugs CP2. At least some of the second conductive plugs CP2 may be formed in the first device region R1 or in the second device region R2.

A power line VDD may be connected to the fin-type active region FA in the first device region R1. A ground line VSS may be connected to the fin-type active region FA in the second device region R1. The first conductive plugs CP1 and the second conductive plugs CP2 may be connected to a plurality of interconnection layers 198 through the first conductive via contacts VC1 and the second conductive via contacts.

In the integrated circuit device 700 of FIG. 15, a cross-sectional structure taken along line X71-X71' of FIG. 15 may be the same as the cross-sectional structure taken along line X1-X1' of FIG. 2A, 4, 6, 9, 10 or 12. A cross-sectional structure taken along line X72-X72' of FIG. 15 may be the same as the cross-sectional structure taken along line X2-X2' of FIG. 2A, 4, 6, 9, 10 or 12.

Figure 16:
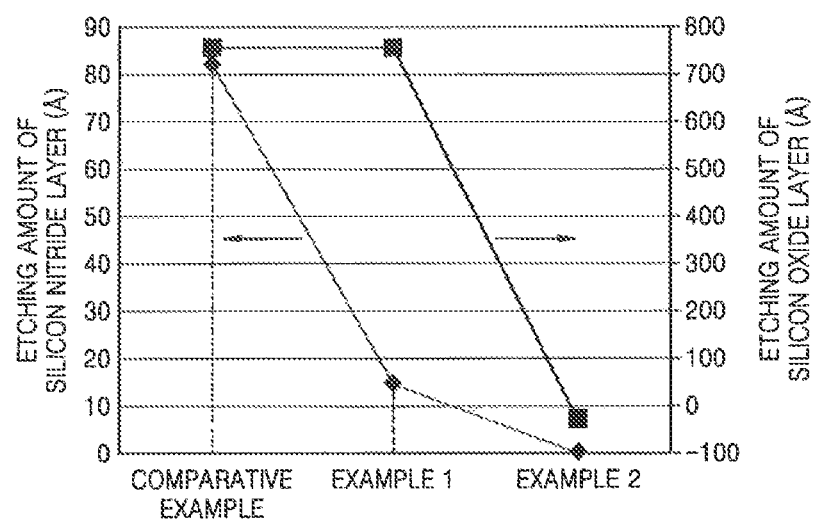
FIG. 16 is a graph illustrating an evaluation result of an etch resistance of a sidewall capping layer of the integrated circuit device shown in FIG. 2A according to an exemplary embodiment of the inventive concept.

FIG. 16 is a graph illustrating an evaluation result of an etch resistance of the sidewall capping layer 182D of the integrated circuit device 100 of FIG. 2A according to an exemplary embodiment of the inventive concept.

To evaluate the etch resistance of the sidewall capping layer 182D, an un-doped nitride layer (Comparative Example), a boron (B)-doped silicon nitride layer (Example 1), and a silicon (Si)-doped silicon nitride layer (Example 2) are simultaneously exposed under an etching condition for removing a polysilazane layer.

From the results of FIG. 16, it can be seen that the boron (B)-doped silicon nitride layer (Example 1), and the silicon (Si)-doped silicon nitride layer (Example 2) have a small etch selectivity with respective to the polysilazane layer compared to the un-doped silicon nitride layer (Comparative Example) under the same etching conditions. Accordingly, the etch resistance of each of the boron (B)-doped silicon nitride layer (Example 1), and the silicon (Si)-doped silicon nitride layer (Example 2) is greater than the etch resistance of the un-doped silicon nitride layer (Comparative Example).

Even if the integrated circuit device including the FinFet having a three-dimensional channel structure and the manufacturing method thereof are described with reference to FIGS. 1A through 15, but the present inventive concepts are not limited thereto. For example, the inventive concept may be applied to an integrated circuit device including a planar metal-oxide semiconductor field effect transistor (MOSFET) and to a manufacturing method of the planar MOSFET.

An integrated circuit device, according to an exemplary embodiment of the inventive concept of the present inventive concept, has a good isolation margin between adjacent contact plugs even when the area of the integrated circuit device is reduced by down-scaling a semiconductor device included in the integrated circuit device.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. An integrated circuit device comprising:
a substrate including a device active region;
a fin-type active region disposed on the device active region;
a first source/drain region disposed on the fin-type active region;

a second source/drain region disposed on the fin-type active region;
a first gate structure disposed on the substrate and crossing the fin-type active region, the first gate structure being disposed between the first source/drain region and the second source/drain region;
an insulating spacer disposed on the substrate and contacting a sidewall of the first gate structure;
a first conductive plug disposed on the fin-type active region, and connected to at least one of the first source/drain region and the second source/drain region;
a capping layer disposed on the first gate structure, wherein a height of the capping layer is greater than a height of the first gate structure;
a second conductive plug formed in a contact hole penetrating the capping layer, the second conductive plug connected to the first gate structure, wherein the capping layer includes a sidewall portion, and a portion of the sidewall portion is below an upper surface of the second conductive plug and above an upper surface of the first conductive plug;
a second gate structure;
a via contact disposed on the first conductive plug and connected to the first conductive plug, wherein the via contact and the first conductive plug are disposed between the first gate structure and the second gate structure; and
an insulating liner disposed between the via contact and the capping layer.

2. The integrated circuit device of claim 1, wherein the first gate structure includes:
a gate insulating layer disposed on the substrate and having a bottom portion and a sidewall portion, the sidewall portion of the gate insulating layer defining a space; and
a gate line disposed in the space.

3. The integrated circuit device of claim 2, wherein the gate line includes at least one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), palladium (Pd), and aluminum (Al).

4. The integrated circuit device of claim 1, wherein the sidewall portion of the capping layer includes a silicon nitride layer doped with at least one of B, Si, C, N, As, P, O, F, Ar, Ge, H, and He.

5. The integrated circuit device of claim 1, wherein the capping layer includes a bottom portion disposed on the first gate structure, wherein the sidewall portion is disposed on the bottom portion of the capping layer and defines a space, and a core portion disposed in the space defined by the sidewall portion of the capping layer,
wherein an etch resistance of the sidewall portion of the capping layer is greater than an etch resistance of the bottom portion of the capping layer under the same etch condition.

6. The integrated circuit device of claim 1, further comprising:
a plug insulating spacer disposed between the second conductive plug and the capping layer.

7. An integrated circuit device comprising:
a substrate including a device active region;
a fin-type active region disposed on the device active region;
a first source/drain region disposed on the fin-type active region;
a second source/drain region disposed on the fin-type active region;
a first gate structure disposed on the substrate and crossing the fin-type active region, the first gate structure being disposed between the first source/drain region and the second source/drain region;
an insulating spacer disposed on the substrate and contacting a sidewall of the first gate structure;
a conductive plug disposed on the fin-type active region, and connected to at least one of the first source/drain region and the second source/drain region; and
a capping layer disposed on the first gate structure, wherein an upper surface of the conductive plug is disposed below an upper surface of the capping layer,
wherein a sidewall portion of the capping layer includes a silicon nitride layer doped with B, Si, C, N, As, P, O, F, Ar, Ge, H, or He,
wherein the capping layer includes a bottom portion disposed on the first gate structure, wherein the sidewall portion of the capping layer is disposed on the bottom portion of the capping layer and defines a space, and a core portion disposed in the space defined by the sidewall portion of the capping layer,
wherein an etch resistance of the sidewall portion of the capping layer is greater than an etch resistance of the bottom portion of the capping layer under the same etch condition, and
wherein the etch resistance of the sidewall portion of the capping layer is greater than an etch resistance of the core portion of the capping layer under the same etch condition.

8. The integrated circuit device of claim 7, wherein the first gate structure includes:
a gate insulating layer disposed on the substrate and having a bottom portion and a sidewall portion, the sidewall portion of the gate insulating layer defining a space; and
a gate line disposed in the space.

9. The integrated circuit device of claim 7, further comprising:
a third source/drain region disposed on the fin-type active region; and
a second gate structure disposed on the substrate and crossing the fin-type active region, the second gate structure being disposed between the second source/drain region and the third source/drain region.

10. The integrated circuit device of claim 9, further comprising:
a via contact disposed on the conductive plug and connected to the conductive plug, the via contact and the conductive plug being disposed between the first gate structure and the second gate structure; and
an insulating liner disposed between the via contact and the capping layer.

11. An integrated circuit device comprising:
a substrate including a device active region;
a fin-type active region disposed on the device active region;
a first source/drain region disposed on the fin-type active region;
a second source/drain region disposed on the fin-type active region;
a first gate line disposed between the first source/drain region and the second source/drain region, the first gate line crossing the fin-type active region;
an insulating spacer disposed on sidewalls of the first gate line;

a conductive plug connected to the first source/drain region; and a capping layer disposed on the first gate line, wherein the first gate line overlaps an upper surface and sidewalls of the fin-type active region, the capping layer includes a first portion disposed on or above the first gate line, and a second portion disposed on or above the insulating spacer, and the first portion of the capping layer includes a composition different from a composition of the second portion of the capping layer, wherein the capping layer includes a third portion disposed between the first gate line and the first portion of the capping layer, and disposed between the insulating spacer and the second portion of the capping layer.

12. The integrated circuit device of claim 11, wherein the second portion of the capping layer contacts the first portion of the capping layer and the conductive plug.

13. The integrated circuit device of claim 11, wherein an etch resistance of the second portion of the capping layer is different from an etch resistance of the third portion of the capping layer under the same etch condition.

14. The integrated circuit device of claim 11, further comprising:

a second gate line; and a via contact disposed on the conductive plug and connected to the conductive plug, wherein the via contact and the conductive plug are disposed between the first gate line and the second gate line.

15. The integrated circuit device of claim 14, further comprising an insulating liner disposed between the via contact and the capping layer.

* * * * *